United States Patent
Liao et al.

(10) Patent No.: US 12,014,955 B2
(45) Date of Patent: Jun. 18, 2024

(54) METHOD FOR FABRICATING CONDUCTIVE LAYER STACK AND METHOD FOR FABRICATING SEMICONDUCTOR DEVICE WITH GATE CONTACT

(71) Applicant: NANYA TECHNOLOGY CORPORATION, New Taipei (TW)

(72) Inventors: Che-Hsien Liao, New Taipei (TW); Yueh Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 158 days.

(21) Appl. No.: 17/573,832

(22) Filed: Jan. 12, 2022

(65) Prior Publication Data

US 2023/0223300 A1 Jul. 13, 2023

(51) Int. Cl.
H01L 21/768 (2006.01)
H01L 23/528 (2006.01)
H01L 23/532 (2006.01)

(52) U.S. Cl.
CPC .. *H01L 21/76846* (2013.01); *H01L 21/76871* (2013.01); *H01L 21/76889* (2013.01); *H01L 23/5283* (2013.01); *H01L 23/53266* (2013.01)

(58) Field of Classification Search
CPC ......... H01L 21/76846; H01L 21/76871; H01L 21/76889; H01L 23/5283; H01L 23/53266; H01L 21/76876; H01L 21/76877
See application file for complete search history.

(56) References Cited

U.S. PATENT DOCUMENTS

| | | | | |
|---|---|---|---|---|
| 5,654,233 | A | 8/1997 | Yu | |
| 5,843,843 | A * | 12/1998 | Lee | H01L 21/76856 257/E21.585 |
| 6,048,792 | A * | 4/2000 | Watanabe | H01L 21/76846 257/E21.585 |
| 7,405,158 | B2 * | 7/2008 | Lai | H01L 21/28562 257/E21.585 |
| 2008/0265419 | A1 | 10/2008 | Frohberg et al. | |

(Continued)

FOREIGN PATENT DOCUMENTS

| | | |
|---|---|---|
| TW | I292190 B | 1/2008 |
| TW | 201526090 A | 7/2015 |
| TW | 201701335 A | 1/2017 |

OTHER PUBLICATIONS

Yang et al., "Low-resistivity α-phase tungsten films grown by hot-wire assisted atomic layer deposition in high-aspect-ratio structures," Thin Solid Films vol. 646, Jan. 31, 2018, pp. 199-208. (Year: 2018).*

(Continued)

*Primary Examiner* — Julia Slutsker
(74) *Attorney, Agent, or Firm* — MUNCY, GEISSLER, OLDS & LOWE, P.C.

(57) ABSTRACT

The present application discloses a method for fabricating a conductive layer stack. The method includes forming an intervening layer on an under-layer; and forming a filler layer on the intervening layer, wherein the filler layer comprises tungsten. The intervening layer comprises tungsten silicide and a thickness of the intervening layer is greater than 4.1 nm. The under-layer comprises titanium nitride and comprises a columnar grain structure.

10 Claims, 34 Drawing Sheets

(56) References Cited

U.S. PATENT DOCUMENTS

| | | |
|---|---|---|
| 2013/0109172 A1 | 5/2013 | Collins et al. |
| 2017/0125538 A1* | 5/2017 | Sharangpani .......... H10B 12/00 |
| 2019/0006515 A1 | 1/2019 | Cheng et al. |
| 2020/0211843 A1 | 7/2020 | Economy et al. |
| 2022/0051976 A1* | 2/2022 | Pranatharthi Haran .................... H01L 23/5226 |
| 2023/0223300 A1 | 7/2023 | Liao et al. |

OTHER PUBLICATIONS

U.S. Appl. No. 17/573,781, filed Jan. 12, 2022.

\* cited by examiner

METHOD FOR FABRICATING CONDUCTIVE LAYER STACK AND METHOD FOR FABRICATING SEMICONDUCTOR DEVICE WITH GATE CONTACT

TECHNICAL FIELD

The present disclosure relates to methods for fabricating a conductive layer stack and a semiconductor device, and more particularly, to methods for fabricating a conductive layer stack and a semiconductor device with a gate contact.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a conductive layer stack including an intervening layer comprising tungsten silicide and positioned on an under-layer; a filler layer comprising tungsten and positioned on the intervening layer. The under-layer comprises titanium nitride and comprises a columnar grain structure. A thickness of the intervening layer is greater than about 4.1 nm.

Another aspect of the present disclosure provides a semiconductor device including a substrate; a gate structure positioned on the substrate; a gate contact comprising: a gate contact barrier layer positioned on the gate structure and comprising titanium nitride having a columnar grain structure; a gate contact intervening layer positioned on the gate contact barrier layer and comprising tungsten silicide; a gate contact filler layer positioned on the gate contact barrier layer and comprising tungsten. A thickness of the gate contact intervening layer is greater than about 4.1 nm.

Another aspect of the present disclosure provides a method for fabricating a conductive layer stack including forming an intervening layer on an under-layer; and forming a filler layer on the intervening layer, wherein the filler layer comprises tungsten. The intervening layer comprises tungsten silicide and a thickness of the intervening layer is greater than 4.1 nm. The under-layer comprises titanium nitride and comprises a columnar grain structure.

Another aspect of the present disclosure provides a method for fabricating a semiconductor device including providing a substrate; forming a gate structure on the substrate; and forming a gate contact on the gate structure comprising: forming a gate contact barrier layer on the gate structure; forming a gate contact intervening layer on the gate contact barrier layer; and forming a gate contact filler layer on the gate contact barrier layer. The gate contact barrier layer comprises titanium nitride having a columnar grain structure. The gate contact intervening layer comprising tungsten silicide, and a thickness of the gate contact intervening layer is greater than about 4.1 nm. The gate contact filler layer comprises alpha phase tungsten.

Due to the design of the semiconductor device of the present disclosure, the intervening layer is formed with a thickness greater than 4.1 nm to reduce or avoid the resistance uniformity issue. As a result, the reliability, yield, and performance of the semiconductor device may be improved. In addition, the filler layer deposited using germanium-containing reducing agents may reduce resistance, thin filler nucleation layer that yield alpha-tungsten growth, with the resulting filler bulk layer causing has little or no defects.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
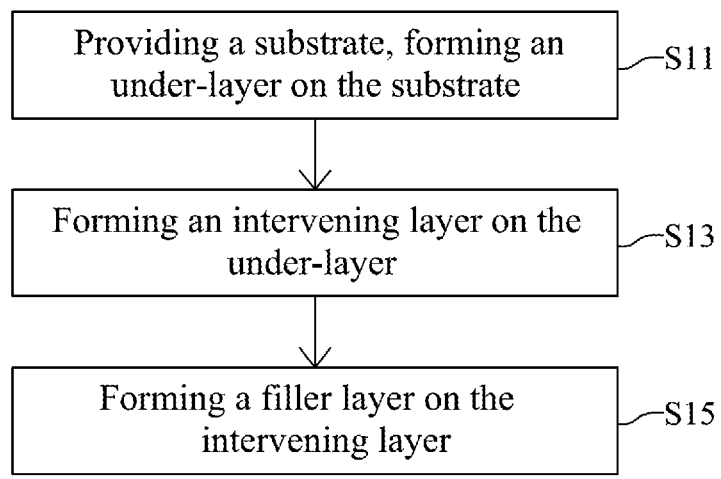
FIG. 1 illustrates, in a flowchart diagram form, a method for fabricating a conductive layer stack in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
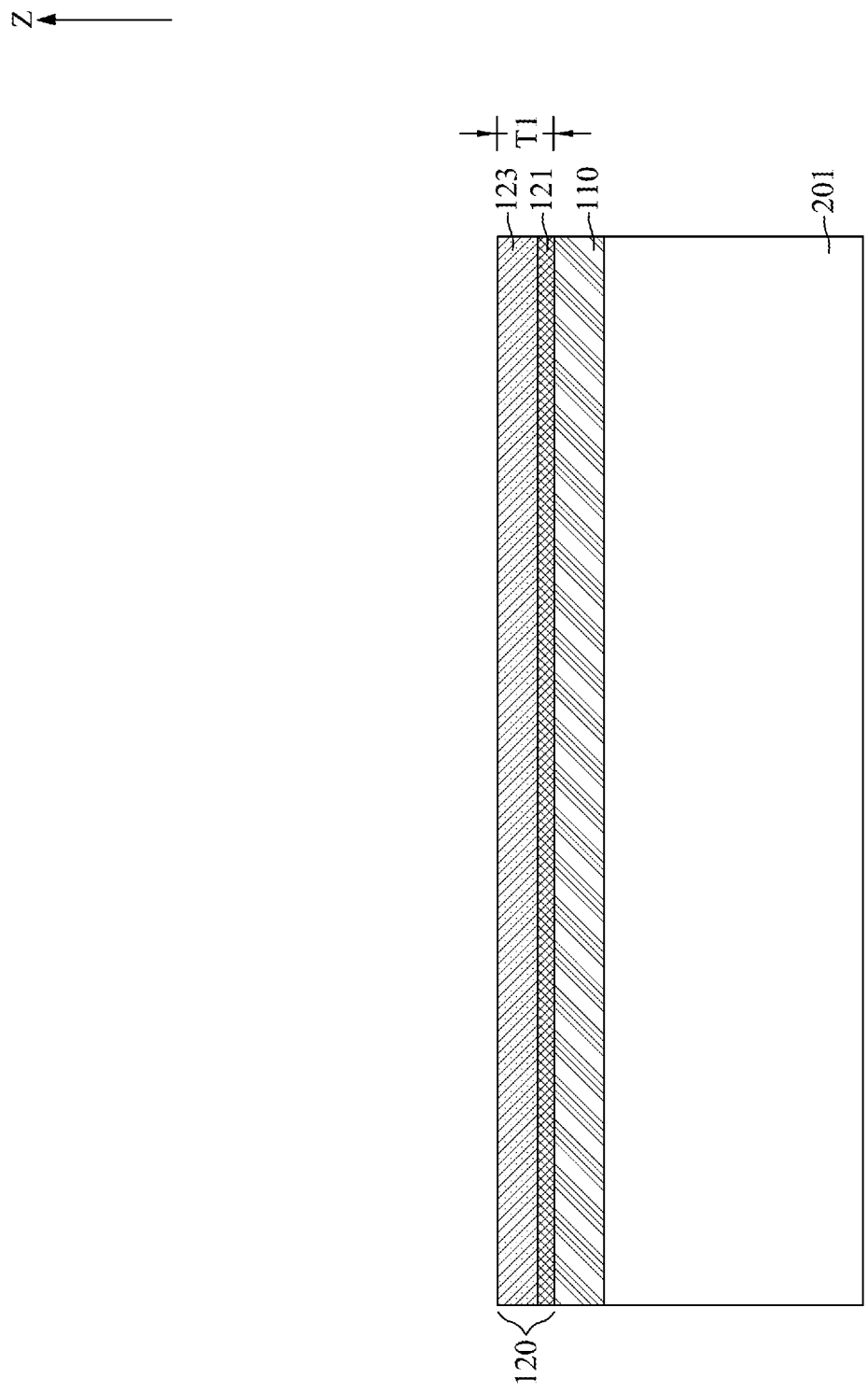
FIGS. 2 and 3 illustrate, in schematic cross-sectional view diagrams, a flow for fabricating the conductive layer stack in accordance with one embodiment of the present disclosure.
Figure 3:
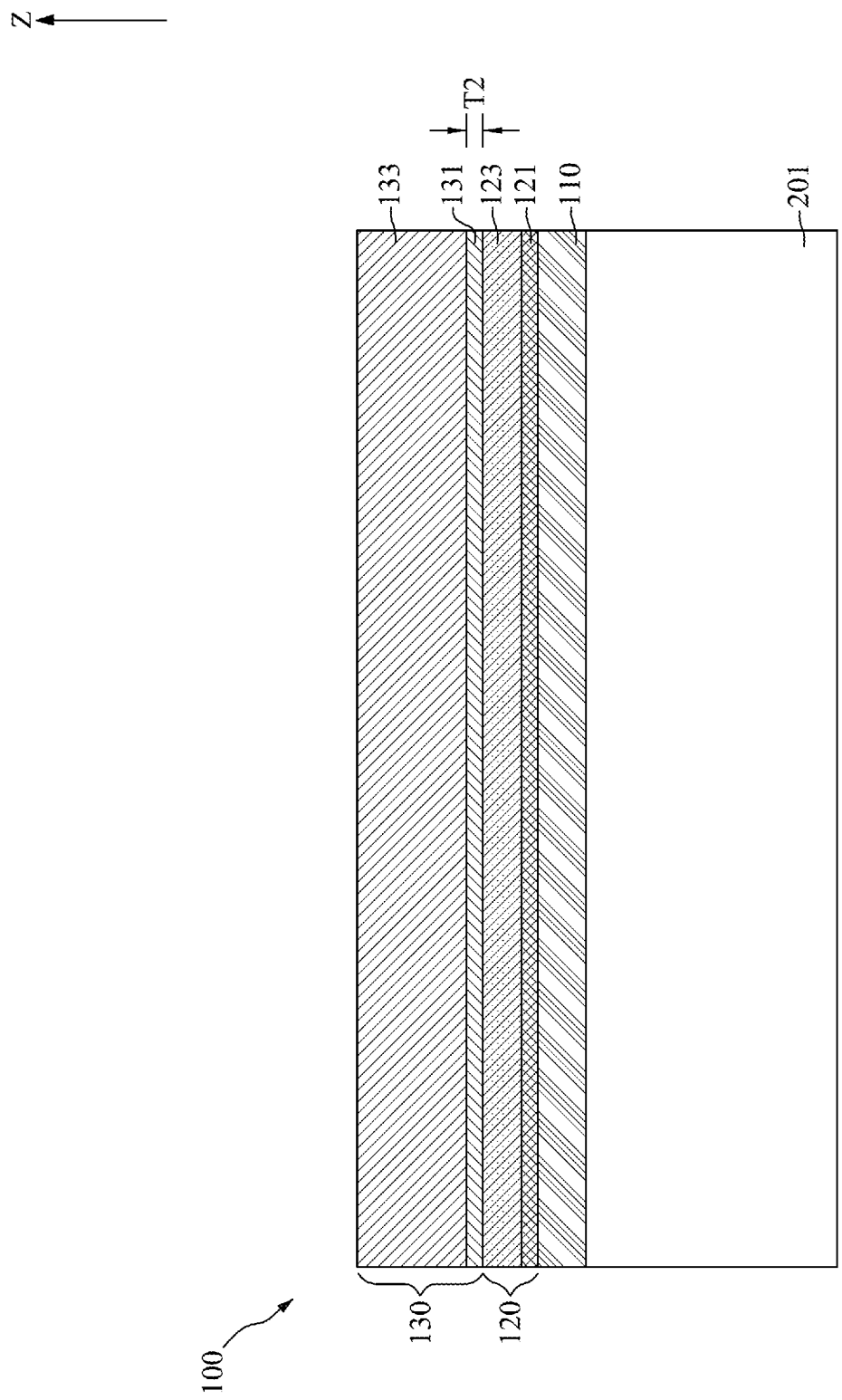

FIG. 1 illustrates, in a flowchart diagram form, a method 10 for fabricating a conductive layer stack 100 in accordance with one embodiment of the present disclosure. FIGS. 2 and 3 illustrate, in schematic cross-sectional view diagrams, a flow for fabricating the conductive layer stack 100 in accordance with one embodiment of the present disclosure.

With reference to FIGS. 1 and 2, at step S11, a substrate 201 may be provided, an under-layer 110 may be formed on the substrate 201.

With reference to FIG. 2, the substrate 201 may include a silicon-containing material. Illustrative examples of silicon-containing materials suitable for the substrate 201 may include, but are not limited to, silicon, silicon germanium, carbon doped silicon germanium, silicon germanium carbide, carbon-doped silicon, silicon carbide, and multi-layers thereof. Although silicon is the predominantly used semiconductor material in wafer fabrication, in some embodiments, alternative semiconductor materials can be employed as additional layers, such as, but not limited to, germanium, gallium arsenide, gallium nitride, silicon germanium, cadmium telluride, zinc selenide, germanium tin, etc.

With reference to FIG. 2, the under-layer 110 may be a barrier layer or adhesion layer. Non-limiting examples of the under-layer 110 include a conductive layer or a dielectric layer, e.g., silicon oxide, silicon nitride, silicon carbide, metal oxide, metal nitride, metal carbide, and metal layer. In some embodiments, the under-layer 110 may be titanium nitride, titanium metal, tungsten nitride, titanium aluminide, or a titanium oxide. In the present embodiment, the under-layer 110 may be a barrier layer and may be formed of titanium nitride. The titanium nitride barrier layer may include a columnar grain structure.

With reference to FIGS. 1 and 2, at step S13, an intervening layer 120 may be formed on the under-layer 110.

With reference to FIG. 2, the intervening layer 120 may include amorphous tungsten silicide. The thickness T1 of the intervening layer 120 may be greater than about 4.1 nm. In some embodiments, the thickness T1 of the intervening layer 120 may be greater than about 4.3 nm, than about 4.6 nm, or than about 5.2 nm. In some embodiments, the thickness T1 the intervening layer 120 may be between about 4.3 nm and about 4.6 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, in some embodiments, the intervening layer 120 may include an intervening nucleation layer 121 and an intervening bulk layer 123. The intervening nucleation layer 121 may be firstly formed on the under-layer 110. Subsequently, the intervening bulk layer 123 may be formed on the intervening nucleation layer 121.

In some embodiments, the intervening nucleation layer 121 and the intervening bulk layer 123 may be formed of tungsten silicide. Detailedly, the reactant gas (e.g., tungsten hexafluoride), the inert carrier gases (e.g., argon, nitrogen, and helium), and the desired silicon source gas may be combined in a premix chamber and then flow over the intermediate semiconductor device including the under-layer 110. The silicon source gas may be silane initially. The gas mixture may be used to form the intervening nucleation layer 121. Following formation of the intervening nucleation layer 121, the silicon source gas may be switched and dichlorosilane may be used as the silicon source gas for deposition of the intervening bulk layer 123. The switching of the silicon source gas may be performed abruptly or gradually.

In some embodiments, the flow rate of the inert carrier gases may be as great as five to ten times the flow rate of the silicon source gas (either silane or dichlorosilane). In some embodiments, the flow rate of the silicon source gas (either silane or dichlorosilane) in turn may be about 50 to 100 times the flow rate of the reactant gas. In some embodiments, the silane flow rate may be about 400 standard cubic centimeters per minute (sccm). The flow rate of reactant gas may be about 4 sccm. The flow rate of the inert carrier gases may be about 2800 sccm.

In some embodiments, the process temperature of forming the intervening nucleation layer 121 may be less than 500° C. In some embodiments, the process temperature of forming the intervening nucleation layer 121 may be about 450° C. In some embodiments, the process temperature of forming the intervening nucleation layer 121 may be about 400° C. or less than 400° C. In some embodiments, the process temperature of forming the intervening nucleation layer 121 may be between about 250° C. and about 400° C. In some embodiments, the intervening bulk layer 123 may be formed at a temperature the same as the process temperature of forming the intervening nucleation layer 121.

In some embodiments, the process duration of forming the intervening nucleation layer 121 may be between about 1 seconds and about 25 seconds.

In some embodiments, the substrate temperature of forming the intervening nucleation layer 121 may be between about 200° C. and about 500° C.

Due to the presence of the intervening nucleation layer 121, the intervening bulk layer 123 may be deposited using a process without any assistance of plasma enhance technique. As a result, the equipment requirement for forming the intervening layer 120 may be easier and the cost of forming the intervening layer 120 may be reduced.

In some embodiments, the formation of the intervening nucleation layer 121 may be optional. The intervening bulk layer 123 may be directly formed on the under-layer 110.

With reference to FIGS. 1 and 3, at step S15, a filler layer 130 may be formed on the intervening layer 120.

With reference to FIG. 3, in some embodiments, the filler layer 130 may include a filler nucleation layer 131 and a filler bulk layer 133. The filler nucleation layer 131 may be firstly formed on the intervening bulk layer 123 of the intervening layer 120. Subsequently, the filler bulk layer 133 may be formed on the filler nucleation layer 131. In some embodiments, a grain size of the filler bulk layer 133 may be greater than 30 nm, than 50 nm, than 70 nm, than 80 nm, than 85 nm, or than 87 nm. In some embodiments, the filler bulk layer 133 may include alpha phase tungsten.

In some embodiments, the filler nucleation layer 131 and the filler bulk layer 133 may include tungsten. Tungsten may be particularly useful in gate electrodes and word and bit lines in dynamic random access memory types of integrated circuit devices because of its thermal stability during subsequent high temperature processes, where processing temperatures may reach 900° C. or more. Additionally, tungsten is a highly refractive material which offers good oxidation resistance and also lower resistivity.

In some embodiments, the filler nucleation layer 131 may be a thin conformal layer that serves to facilitate the subsequent formation of a bulk material (i.e., the filler bulk layer 133) thereon. Conforming to the underlying intervening layer 120 may be critical to support high quality deposition. In some embodiments, the filler nucleation layer 131 may be formed by a pulsed nucleation layer method.

In the pulsed nucleation layer method, pulses of reactant may be sequentially injected and purged from the reaction chamber, typically by a pulse of a purge gas between reactants. A first reactant may be adsorbed onto the substrate (e.g., the intervening layer 120), available to react with the next reactant. The process is repeated in a cyclical fashion until the desired thickness is achieved. It should be noted that, the pulsed nucleation layer method may be generally distinguished from atomic layer deposition by its higher operating pressure range (greater than 1 Torr) and its higher growth rate per cycle (greater than 1 monolayer film growth per cycle). The chamber pressure during the pulsed nucleation layer method may range from about 1 Torr to about 400 Torr.

In some embodiments, the reactants of forming the filler nucleation layer 131 may be, for example, a boron-containing reducing agent, a silicon-containing reducing agent, a germanium-containing reducing agent, and a tungsten-containing precursor. In some embodiments, the boron-containing reducing agent may be borane or diborane. In some embodiments, the silicon-containing reducing agent may be silane. In some embodiments, the tungsten-containing precursor may include tungsten hexafluoride, tungsten hexachloride, or tungsten hexacarbonyl. In some embodiments, the tungsten-containing precursor may include organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten).

In some embodiments, the germanium-containing reducing agent may be a germane such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, for example, alkyl germanes, alkyl germanium, aminogermanes, carbogermanes, and halogermane.

An exemplary process for forming the filler nucleation layer 131 may be illustrated as follow.

Firstly, the intermediate semiconductor device illustrated in FIG. 2 may be exposed to pulses of the germanium-containing reducing agent in a hydrogen environment to form a layer of germanium on the intervening bulk layer 123. In some embodiments, the hydrogen-to-germanium-containing reducing agent ratio may be about 10:1, about 50:1, about 70:1, or about 100:1. The presence of hydrogen may decrease the thickness deposited per cycle, as well as decrease the resistance of the deposited filler layer 130.

In some embodiments, pulses of one or more additional reducing agents, such as pulses of the boron-containing or silicon-containing reducing agent, may be used. The additional reducing agents may be pulsed sequentially or simultaneously with the germanium-containing reducing agent. In some embodiments, time interval pauses between pulses may be between about 0.5 seconds about 5 seconds. In some embodiments, the pulses of germanium-containing reducing agent may be optional, only the pulses of the boron-containing or silicon-containing reducing agent may be used.

In some embodiments, the duration of pulse may be between about 0.25 seconds and about 30 seconds, between about 0.25 seconds and about 5 seconds, or between about 0.5 seconds and about 3 seconds. The pulse may be sufficient to saturate or oversaturate the surface of the intervening bulk layer 123. In some embodiments, a carrier gas may be used, such as argon, helium, or nitrogen. In some embodiments, an optional purge process may be performed to purge excess germanium-containing reducing agent still in gas phase that did not adsorb to the surface of the intervening bulk layer 123. The purge process may be conducted by flowing an inert gas at a fixed pressure thereby reducing the pressure of the chamber and re-pressurizing the chamber before initiating another gas exposure.

Next, the intermediate semiconductor device may be exposed to pulses of the tungsten-containing precursor. The tungsten-containing precursor reacts with the deposited layer of germanium to form elemental tungsten. In some embodiments, the duration of pulse may be between about 0.25 seconds and about 30 seconds, between about 0.25 seconds to about 5 seconds, or between about 0.5 seconds to about 3 seconds. The pulse may be sufficient to react with the reactive sites on the surface of the intervening bulk layer 123 where germanium adsorbed onto the surface. In some embodiments, time interval pauses between pulses may be between about 0.5 seconds about 5 seconds. In some embodiments, a carrier gas may be used, such as argon, helium, or nitrogen. In some embodiments, exposure to the tungsten-containing precursor may be performed in a hydrogen environment. In some embodiments, an optional purge process may be performed to purge excess tungsten-containing precursor still in gas phase that did not react to the germanium adsorbed onto the surface of the intervening bulk layer 123. The purge process may be conducted by flowing an inert gas at a fixed pressure thereby reducing the pressure of the chamber and re-pressurizing the chamber before initiating another gas exposure.

Finally, exposure to the pulses of the germanium-containing reducing agent and the tungsten-containing precursor may be repeated until a desired thickness of the filler nucleation layer 131 is deposited on the surface of the intervening bulk layer 123. Each repetition of exposure to the pulses of the germanium-containing reducing agent and the tungsten-containing precursor may be referred to as a "cycle." In some embodiments, the thickness T2 of the filler nucleation layer 131 may be less than 1 nm. In some embodiments, the thickness T2 of the filler nucleation layer 131 may be between about 1 nm and about 20 nm. In some embodiments, the thickness T2 of the filler nucleation layer 131 may be between about 1 nm and about 10 nm.

In some embodiments, the order of exposure to the pulses of the germanium-containing reducing agent and the tungsten-containing precursor may be reversed, such that tungsten-containing precursor is pulsed first.

With reference to FIG. 3, the filler bulk layer 133 may be formed on the filler nucleation layer 131 by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or any combination thereof.

For example, the deposition of the filler bulk layer 133 using chemical vapor deposition may include flowing a tungsten-containing precursor and a co-reactant such as a reducing agent to the intermediate semiconductor device including the filler nucleation layer 131. Example process pressure may be between about 10 Torr and about 500 Torr. Example substrate temperature may be between about 250° C. and about 495° C. The tungsten-containing precursor may be, for example, tungsten hexafluoride, tungsten chloride, or tungsten hexacarbonyl. The reducing agent may be, for example, hydrogen gas, silane, disilane, hydrazine, diborane, or germane.

Alternatively, in some embodiments, the filler nucleation layer 131 may be optional. The filler bulk layer 133 may be directly formed on the intervening bulk layer 123 by physical vapor deposition.

It should be noted that the intervening layer 120 formed of tungsten silicide may be consumed during the process of forming the filler bulk layer 133 by physical vapor deposition. If the thickness of the intervening layer 120 is less than 4.0 nm, the intervening layer 120 at wafer edge may be completely consumed (or consumed more) while the intervening layer 120 at wafer center may be partially consumed (or consumed less). Therefore, the bottom under-layer 110 having columnar grain structure at wafer edge may possibly contact the filler layer 130 during formation of the filler layer 130 to affect the final grain structure of the filler layer 130 at wafer edge. As a result, the resistance of the filler layer 130 at wafer edge may be worse than the resistance of the filler layer 130 at wafer center. In other words, the uniformity of the filler layer may be worse.

In the present embodiment, the intervening layer 120 is formed with a thickness greater than 4.0 nm to reduce or avoid the resistance uniformity issue.

With reference to FIG. 3, the under-layer 110, the intervening layer 120, and the filler layer 130 together configure the conductive layer stack 100.

Figure 4:
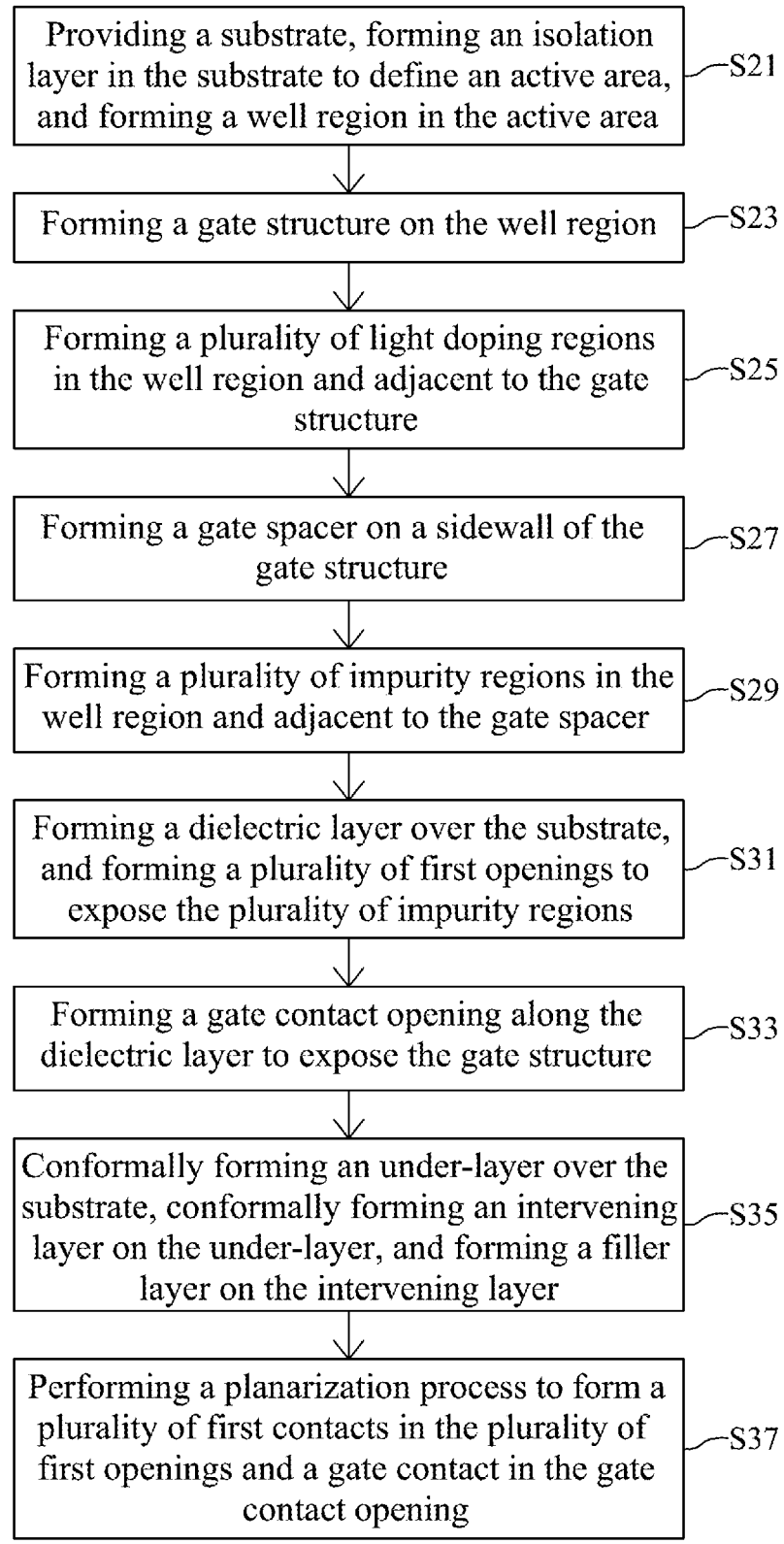
FIG. 4 illustrates, in a flowchart diagram form, a method for fabricating a semiconductor device in accordance with one embodiment of the present disclosure.
Figure 5:
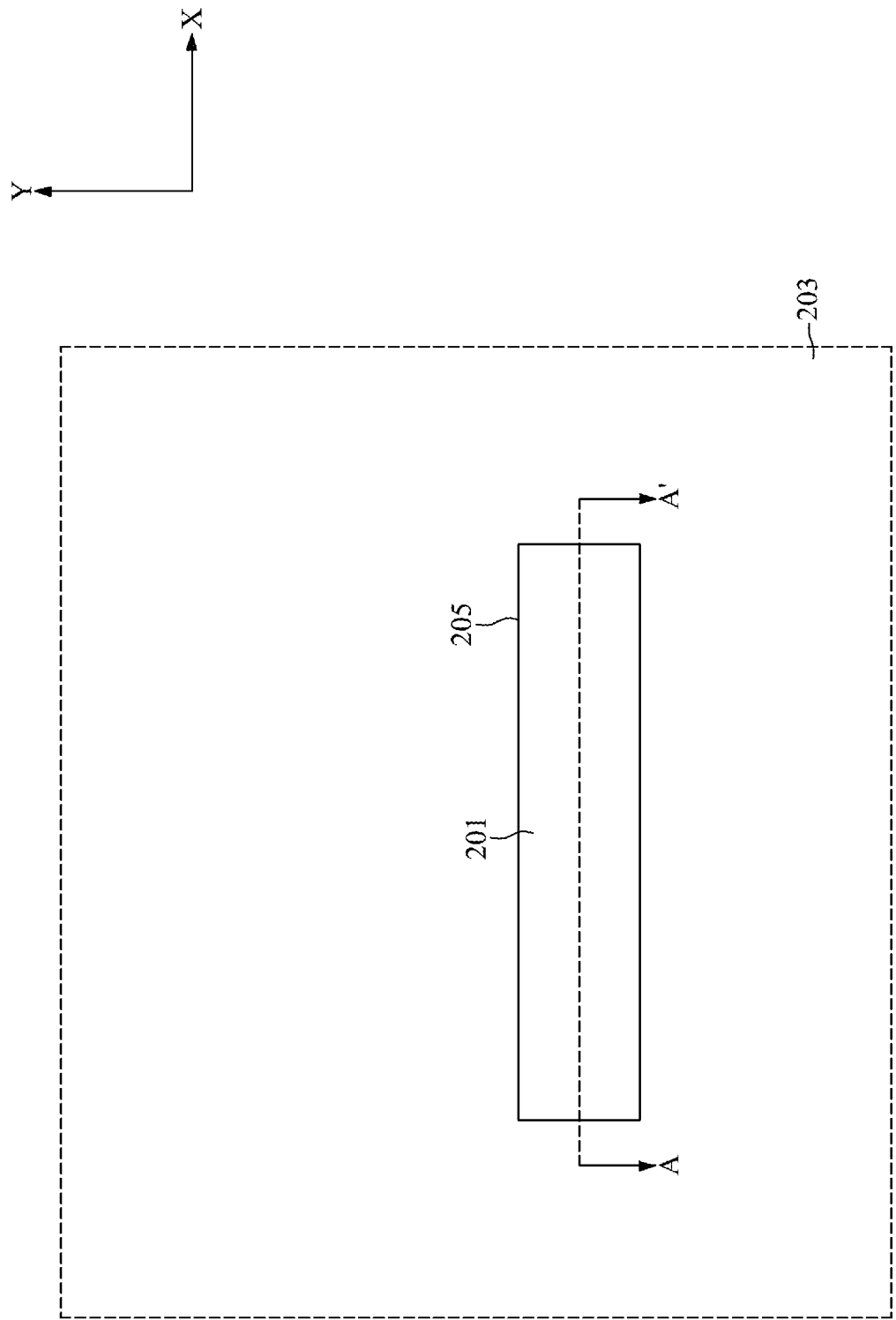
FIG. 5 illustrates, in a schematic top-view diagram, an intermediate semiconductor device in accordance with one embodiment of the present disclosure.
Figure 6:
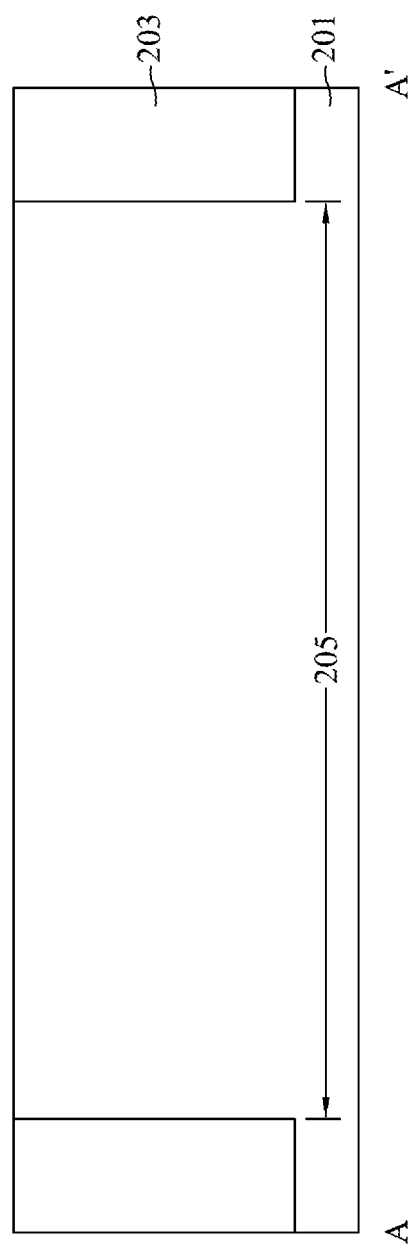
FIG. 6 is a schematic cross-sectional view diagram taken along a line A-A' in FIG. 5.
Figure 7:
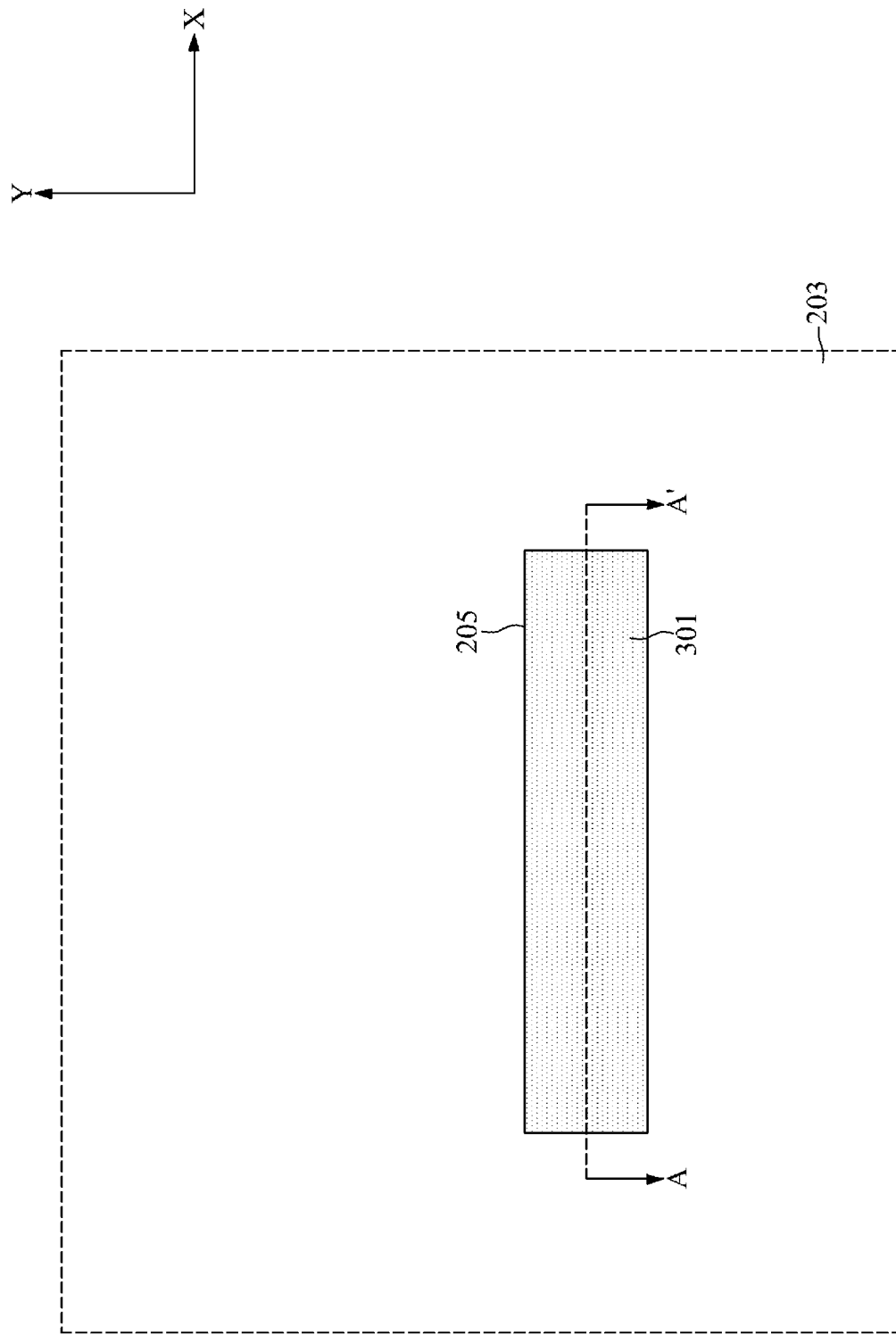
FIG. 7 illustrates, in a schematic top-view diagram, an intermediate semiconductor device in accordance with one embodiment of the present disclosure.
Figure 8:
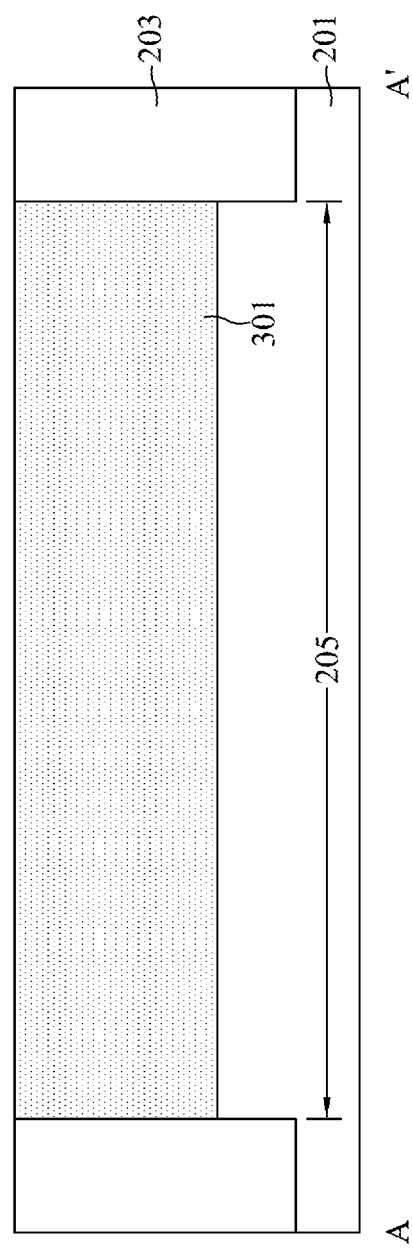
FIG. 8 is a schematic cross-sectional view diagram taken along a line A-A' in FIG. 7.

FIG. 4 illustrates, in a flowchart diagram form, a method 20 for fabricating a semiconductor device 1A in accordance with one embodiment of the present disclosure. FIG. 5 illustrates, in a schematic top-view diagram, an intermediate semiconductor device in accordance with one embodiment of the present disclosure. FIG. 6 is a schematic cross-sectional view diagram taken along a line A-A' in FIG. 5. FIG. 7 illustrates, in a schematic top-view diagram, an intermediate semiconductor device in accordance with one embodiment of the present disclosure. FIG. 8 is a schematic cross-sectional view diagram taken along a line A-A' in FIG. 7.

With reference to FIGS. 4 to 8, at step S21, a substrate 201 may be provided, an isolation layer 203 may be formed in the substrate 201 to define an active area 205, and a well region 301 may be formed in the active area 205.

With reference to FIGS. 5 and 6, the substrate 201 may include a silicon-containing material. Illustrative examples of silicon-containing materials suitable for the substrate 201 may include, but are not limited to, silicon, silicon germanium, carbon doped silicon germanium, silicon germanium carbide, carbon-doped silicon, silicon carbide, and multilayers thereof. Although silicon is the predominantly used semiconductor material in wafer fabrication, in some embodiments, alternative semiconductor materials can be employed as additional layers, such as, but not limited to, germanium, gallium arsenide, gallium nitride, silicon germanium, cadmium telluride, zinc selenide, germanium tin, etc.

A series of deposition processes may be performed to deposit a pad oxide layer (not shown) and a pad nitride layer (not shown) on the substrate 201. A photolithography process may be performed to define the position of the isolation layer 203 by forming a mask layer (not shown) on the pad nitride layer. After the photolithography process, an etch process, such as an anisotropic dry etch process, may be performed to form a trench (not shown) penetrating along the pad nitride layer and the pad oxide layer, and extending to the substrate 201. An insulating material may be deposited into the trench. A planarization process, such as chemical mechanical polishing, may be subsequently performed to remove excess filling material until the top surface of the substrate 201 is exposed so as to form the isolation layer 203. The top surface of the isolation layer 203 and the top surface of the substrate 201 may be substantially coplanar. The insulating material may be, for example, silicon oxide, silicon nitride, silicon oxynitride, silicon nitride oxide, or fluoride-doped silicate.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 5 and 6, the portions of the substrate 201 surrounded by the isolation layer 203 may be referred to as the active area 205.

With reference to FIGS. 7 and 8, the well region 301 may be formed in the active area 205. In some embodiments, a p-type impurity implant process may be performed to form the well region 301 in the active area 205. The p-type impurity implant process may add impurities to an intrinsic semiconductor that creates deficiencies of valence electrons. In a silicon-containing substrate, examples of p-type dopants, i.e., impurities include but are not limited to boron, aluminum, gallium, or indium. In some embodiments, the well region 301 may have the first electrical type (i.e., the p-type).

Figure 9:
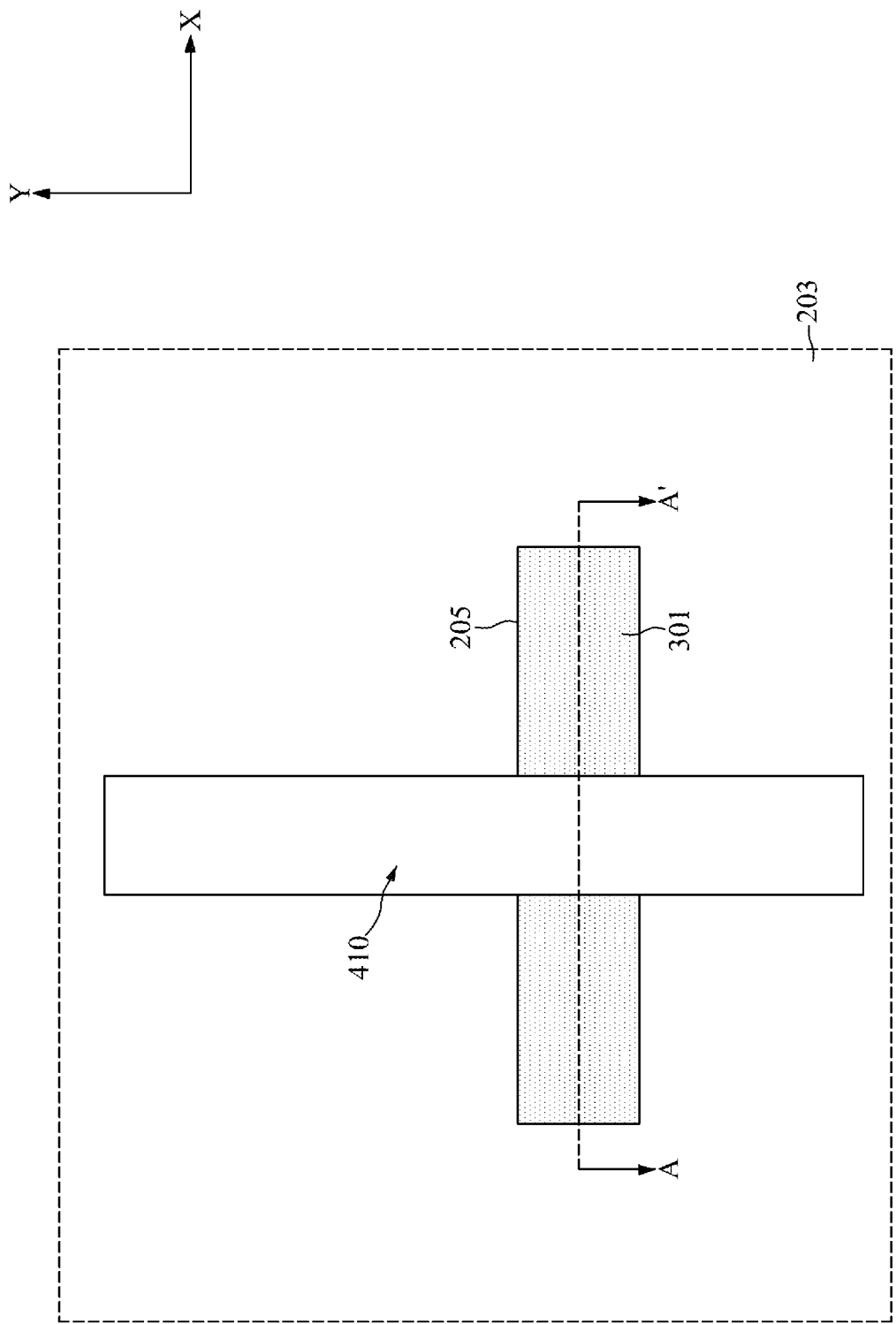
FIG. 9 illustrates, in a schematic top-view diagram, an intermediate semiconductor device in accordance with one embodiment of the present disclosure.
Figure 10:
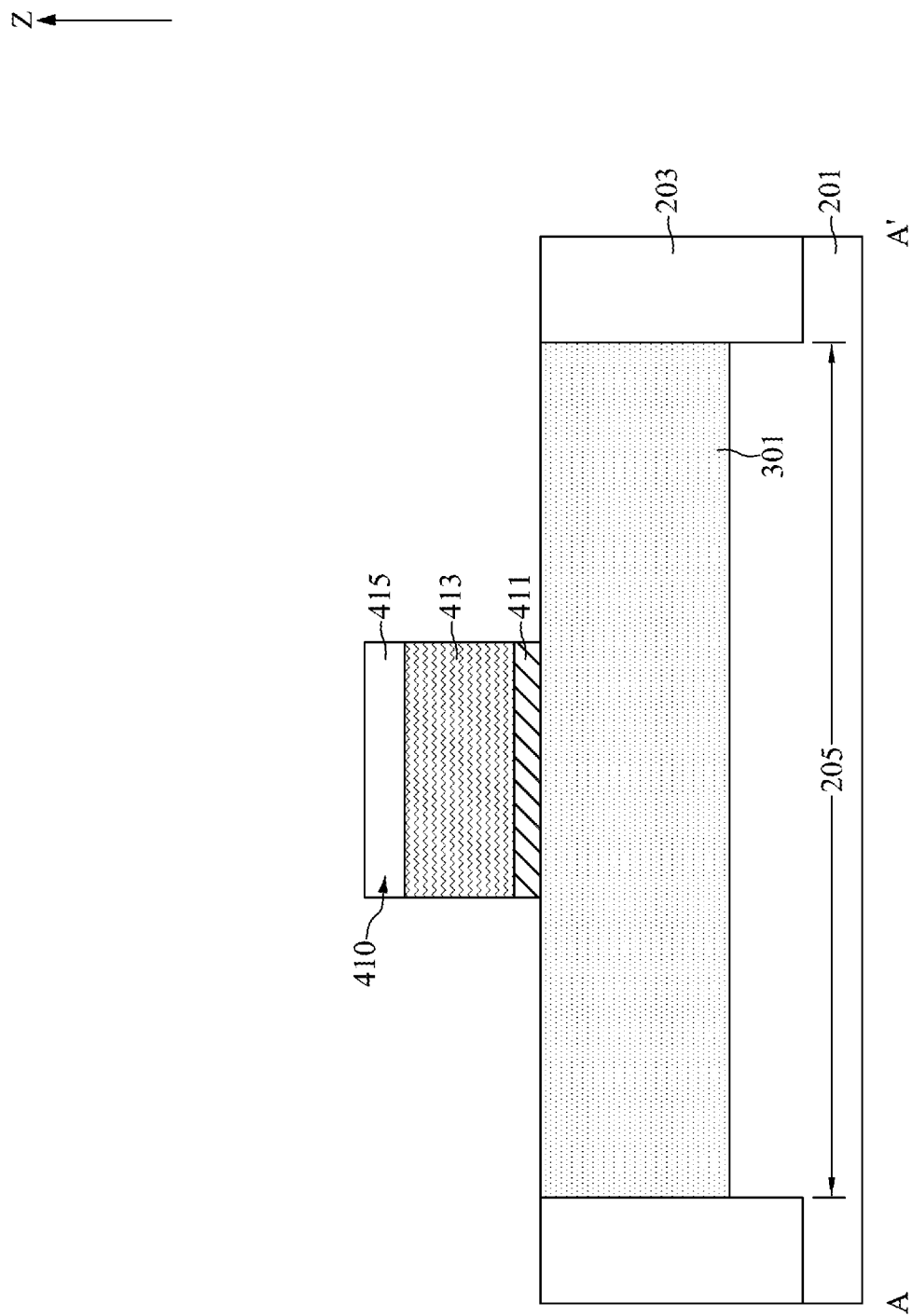
FIG. 10 is a schematic cross-sectional view diagram taken along a line A-A' in FIG. 9.
Figure 11:
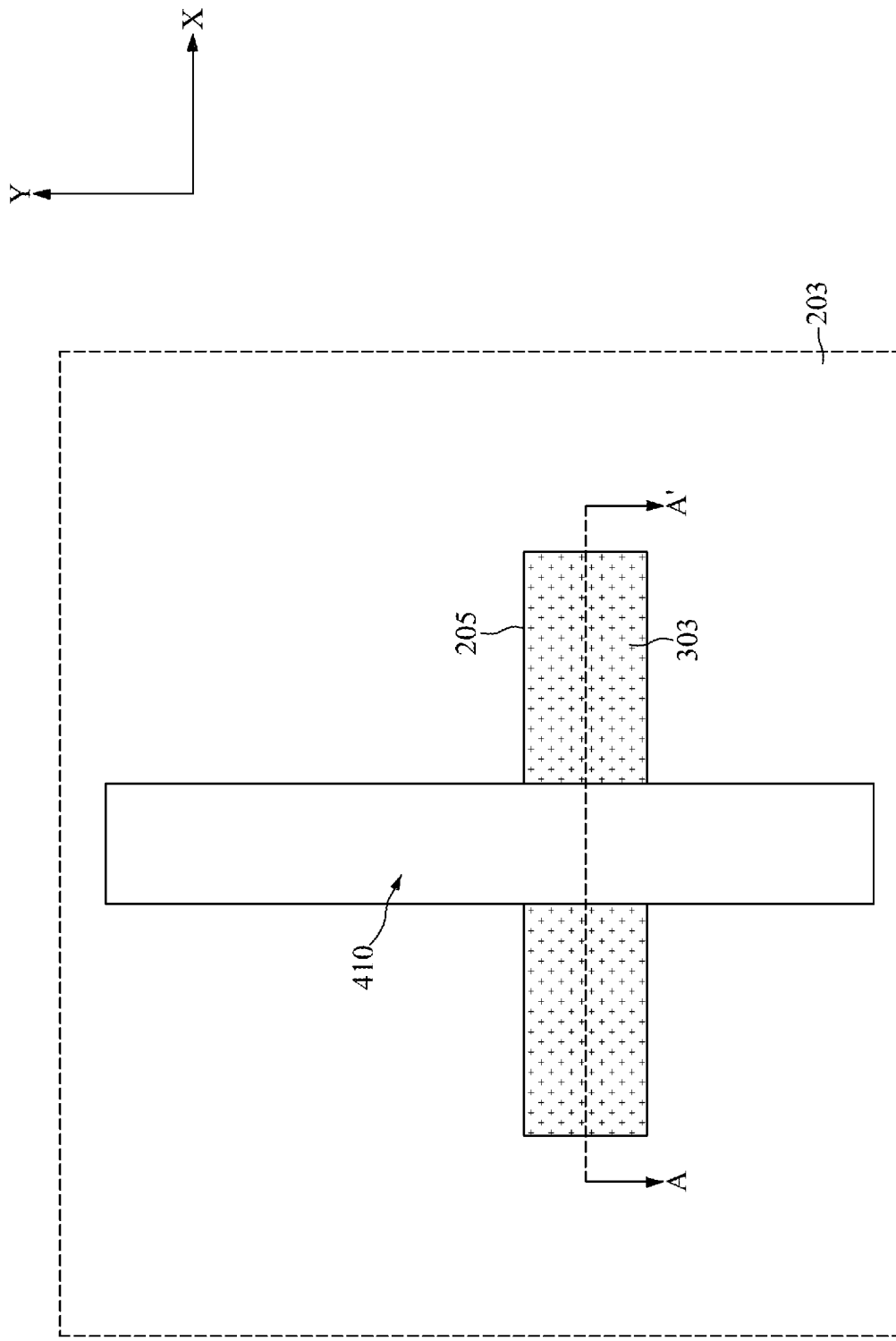
FIG. 11 illustrates, in a schematic top-view diagram, an intermediate semiconductor device in accordance with one embodiment of the present disclosure.
Figure 12:
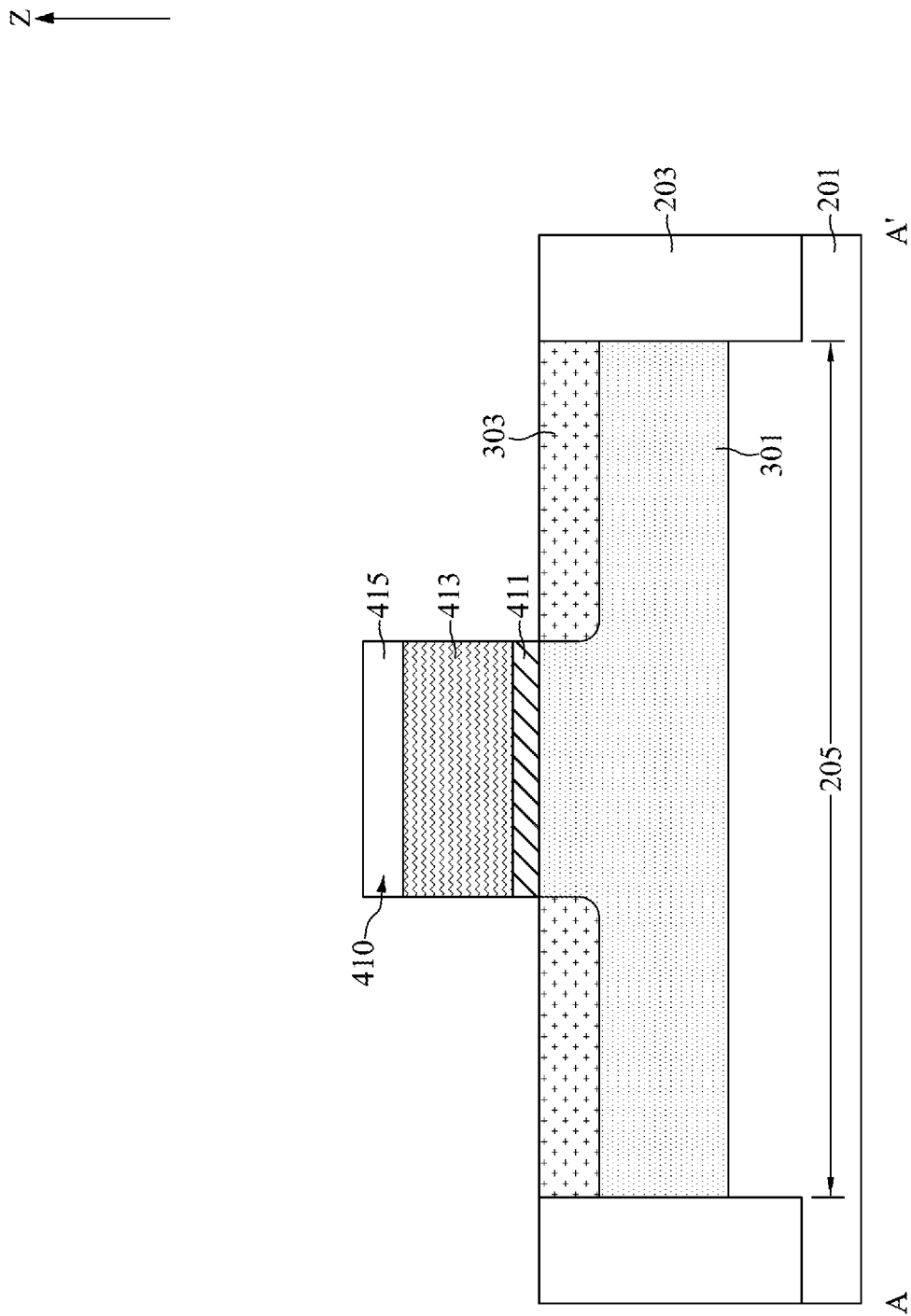
FIG. 12 is a schematic cross-sectional view diagram taken along a line A-A' in FIG. 11.
Figure 13:
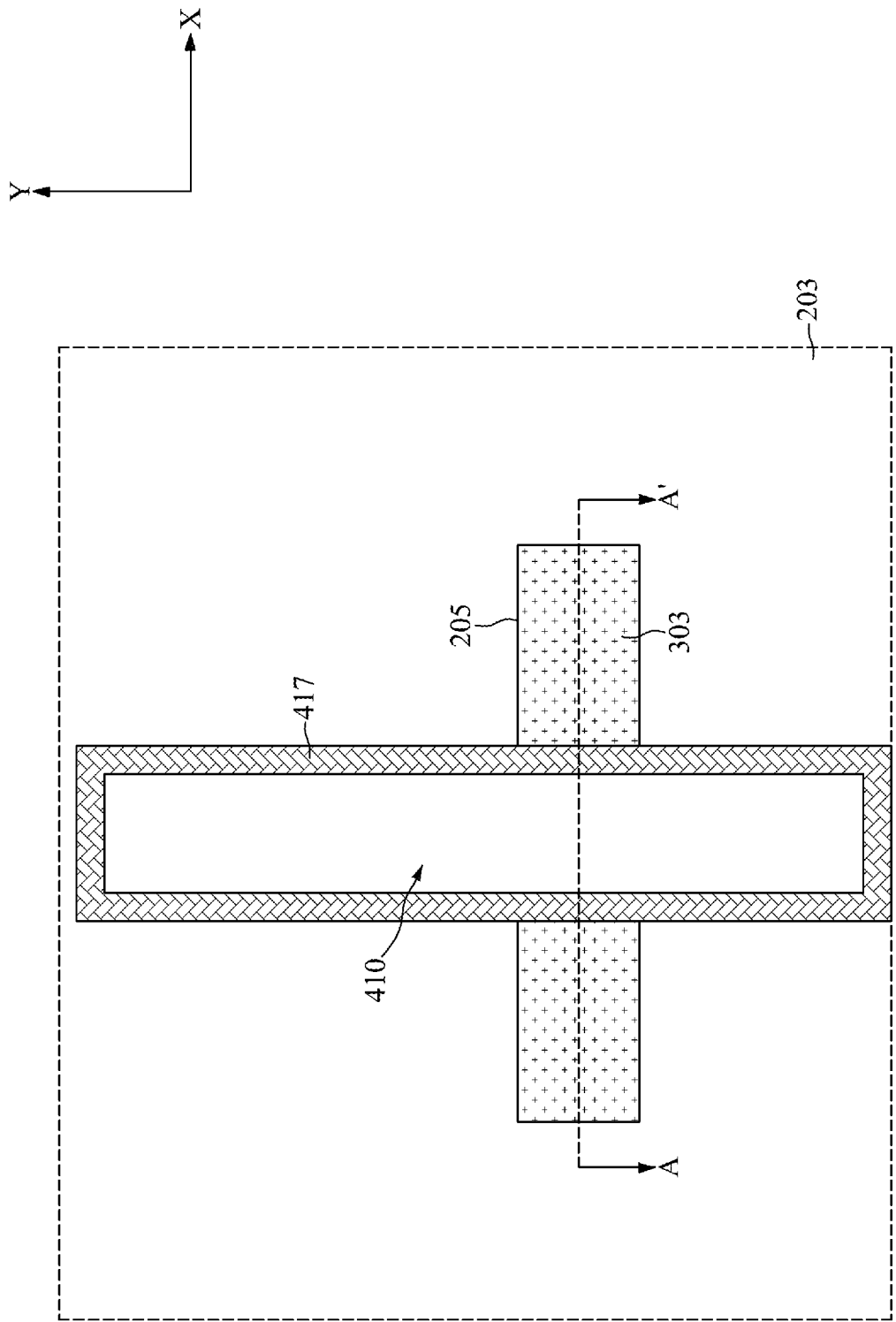
FIG. 13 illustrates, in a schematic top-view diagram, an intermediate semiconductor device in accordance with one embodiment of the present disclosure.
Figure 14:
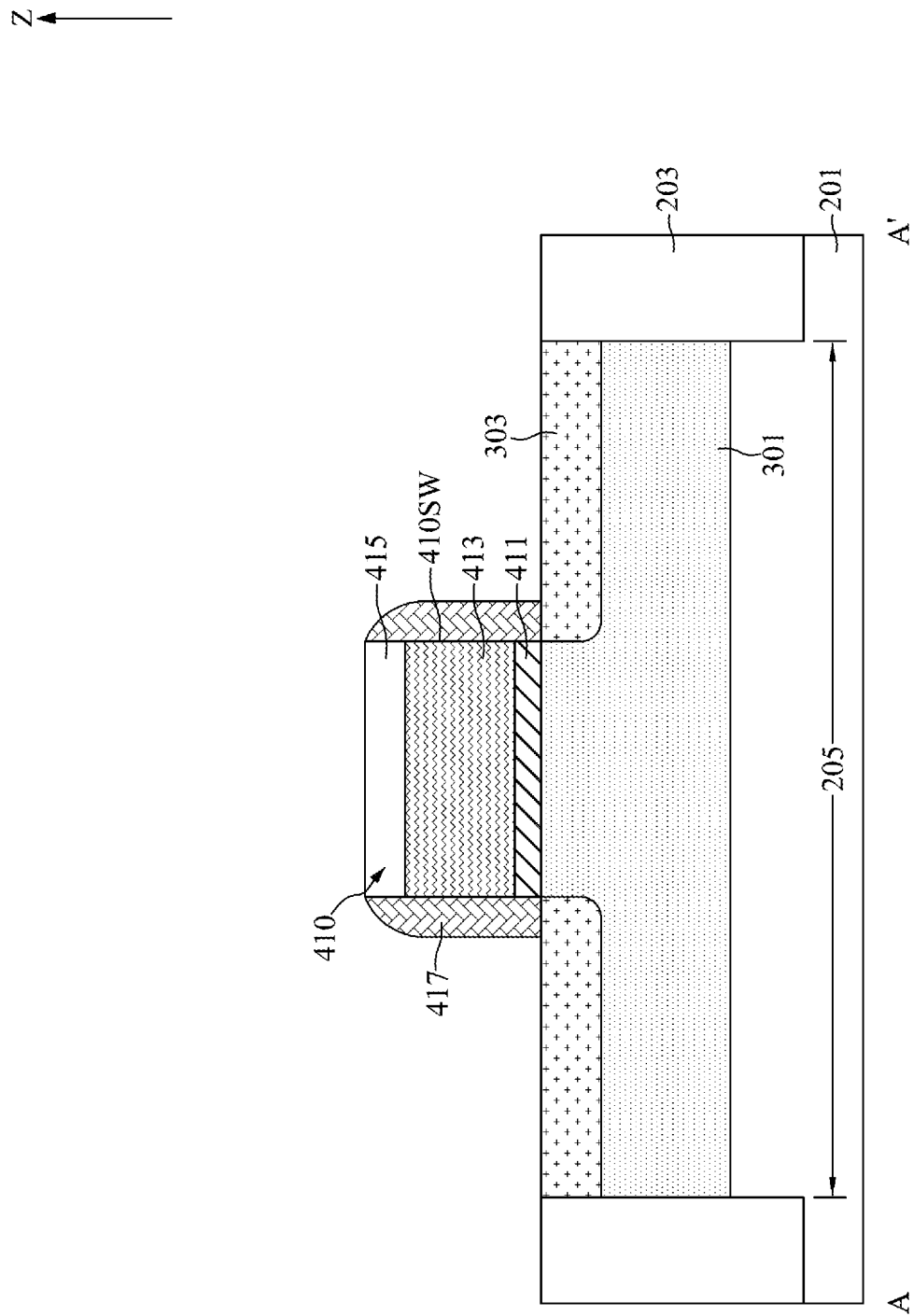
FIG. 14 is a schematic cross-sectional view diagram taken along a line A-A' in FIG. 13.
Figure 15:
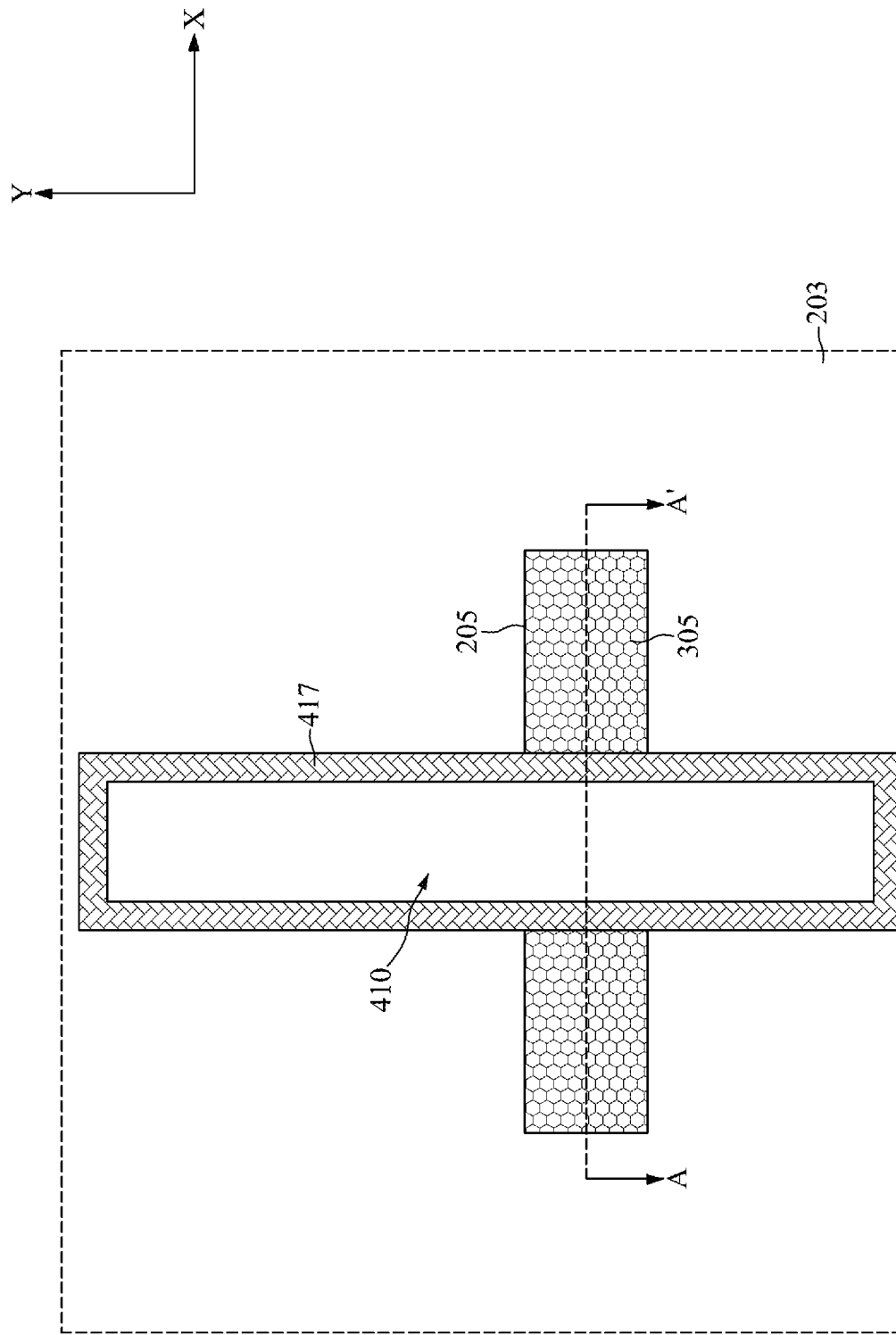
FIG. 15 illustrates, in a schematic top-view diagram, an intermediate semiconductor device in accordance with one embodiment of the present disclosure.
Figure 16:
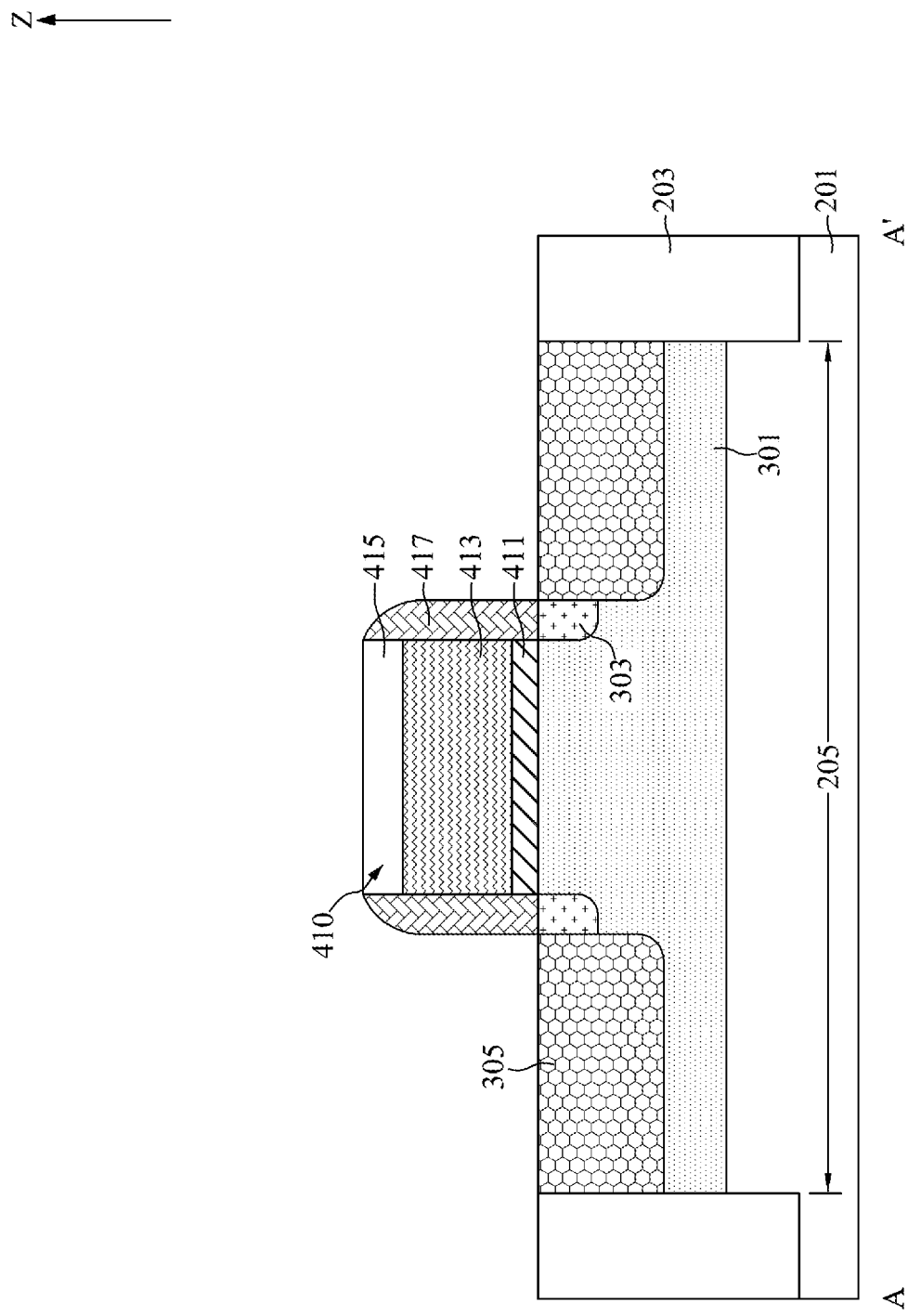
FIG. 16 is a schematic cross-sectional view diagram taken along a line A-A' in FIG. 15.

FIG. 9 illustrates, in a schematic top-view diagram, an intermediate semiconductor device in accordance with one embodiment of the present disclosure. FIG. 10 is a schematic cross-sectional view diagram taken along a line A-A' in FIG. 9. FIG. 11 illustrates, in a schematic top-view diagram, an intermediate semiconductor device in accordance with one embodiment of the present disclosure. FIG. 12 is a schematic cross-sectional view diagram taken along a line A-A' in FIG. 11. FIG. 13 illustrates, in a schematic top-view diagram, an intermediate semiconductor device in accordance with one embodiment of the present disclosure. FIG. 14 is a schematic cross-sectional view diagram taken along a line A-A' in FIG. 13. FIG. 15 illustrates, in a schematic top-view diagram, an intermediate semiconductor device in accordance with one embodiment of the present disclosure. FIG. 16 is a schematic cross-sectional view diagram taken along a line A-A' in FIG. 15.

With reference to FIGS. 4, 9, and 10, at step S23, a gate structure 410 may be formed on the well region 301.

With reference to FIGS. 9 and 10, the gate structure 410 may be formed on the well region 301 and on the isolation layer 203. In a top-view perspective, the gate structure 410 may extend along the direction Y and intersect with the active area 205 which extends along the direction X.

With reference to FIGS. 9 and 10, the gate structure 410 may include a gate insulating layer 411, a gate conductive layer 413, and a gate capping layer 415. The gate insulating layer 411 may be formed on the well region 301. In some embodiments, the thickness of the gate insulating layer 411 may be about 50 angstroms or less than 50 angstroms.

In some embodiments, the gate insulating layer 411 may be formed of, for example, silicon oxide. In some embodiments, the gate insulating layer 411 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

Illustrative examples of high-k dielectric material may include, but are not limited to, hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof.

In some embodiments, the gate insulating layer 411 may be a multilayer structure that includes, for example, one layer of silicon oxide and another layer of high-k dielectric material.

With reference to FIGS. 9 and 10, the gate conductive layer 413 may be formed on the gate insulating layer 411. In some embodiments, the gate conductive layer 413 may be formed of, for example, (doped) polycrystalline silicon, (doped) polycrystalline germanium, (doped) polycrystalline silicon germanium, or other suitable conductive material.

With reference to FIGS. 9 and 10, the gate capping layer 415 may be formed on the gate conductive layer 413. The gate capping layer 415 may be formed of, for example, silicon oxide, silicon nitride, silicon nitride oxide, or silicon oxynitride.

With reference to FIGS. 4, 13, and 14, at step S25, a plurality of light doping regions 303 may be formed in the well region 301 and adjacent to the gate structure 410.

With reference to FIGS. 13 and 14, an n-type impurity implant process may be performed using the gate structure 410 as the masks to form the plurality of light doping regions 303 in the well region 301. The n-type impurity implant process may add impurities that contribute free electrons to an intrinsic semiconductor. In a silicon-containing substrate, examples of n-type dopants, i.e., impurities, include but are not limited to antimony, arsenic, or phosphorous. In some embodiments, the plurality of light doping regions 303 may have the second electrical type (i.e., the n-type) opposite to the first electrical type.

With reference to FIGS. 4, 13, and 14, at step S27, a gate spacer 417 may be formed on a sidewall 410SW of the gate structure 410.

With reference to FIGS. 13 and 14, a layer of spacer material (not shown) may be conformally formed to cover the intermediate semiconductor device illustrated in FIGS. 11 and 12. In some embodiments, the spacer material may be, for example, silicon oxide, silicon nitride, silicon oxynitride, silicon nitride oxide, or other suitable insulating material. An etch process, such as an anisotropic dry etch process, may be performed to remove portions of the spacer material and concurrently form the gate spacer 417 on the sidewall 410SW of the gate structure 410. The gate spacer 417 may also cover portions of the plurality of light doping regions 303.

With reference to FIGS. 4, 15, and 16, at step S29, a plurality of impurity regions 305 may be formed in the well region 301 and adjacent to the gate spacer 417.

With reference to FIGS. 15 and 16, an n-type impurity implant process may be performed using the gate structure 410 and the gate spacer 417 as the masks to form the plurality of impurity regions 305 in the well region 301. The n-type impurity implant process may be similar to that illustrated in FIGS. 11 and 12, and descriptions thereof are not repeated herein. The plurality of impurity regions 305 may be adjacent to the plurality of light doping regions 303.

In some embodiments, the plurality of impurity regions 305 may have the second electrical type (i.e., the n-type) opposite to the first electrical type. The dopant concentration of the plurality of impurity regions 305 may be greater than the dopant concentration of the plurality of light doping regions 303. In some embodiments, the dopant concentration of the plurality of impurity regions 305 may be about 1E19 atoms/cm^3 to about 1E21/cm^3.

Figure 17:
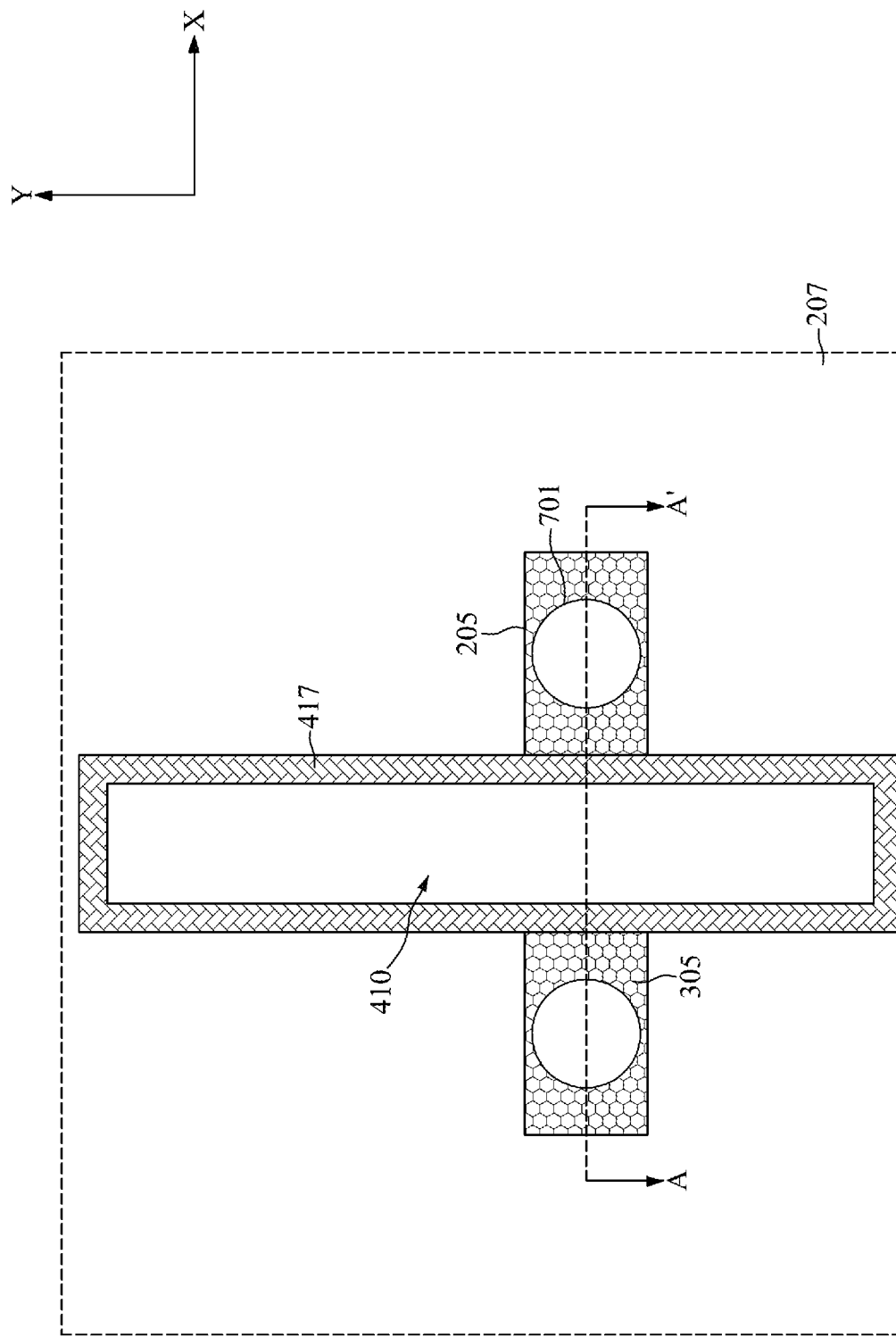
FIG. 17 illustrates, in a schematic top-view diagram, an intermediate semiconductor device in accordance with one embodiment of the present disclosure.
Figure 18:
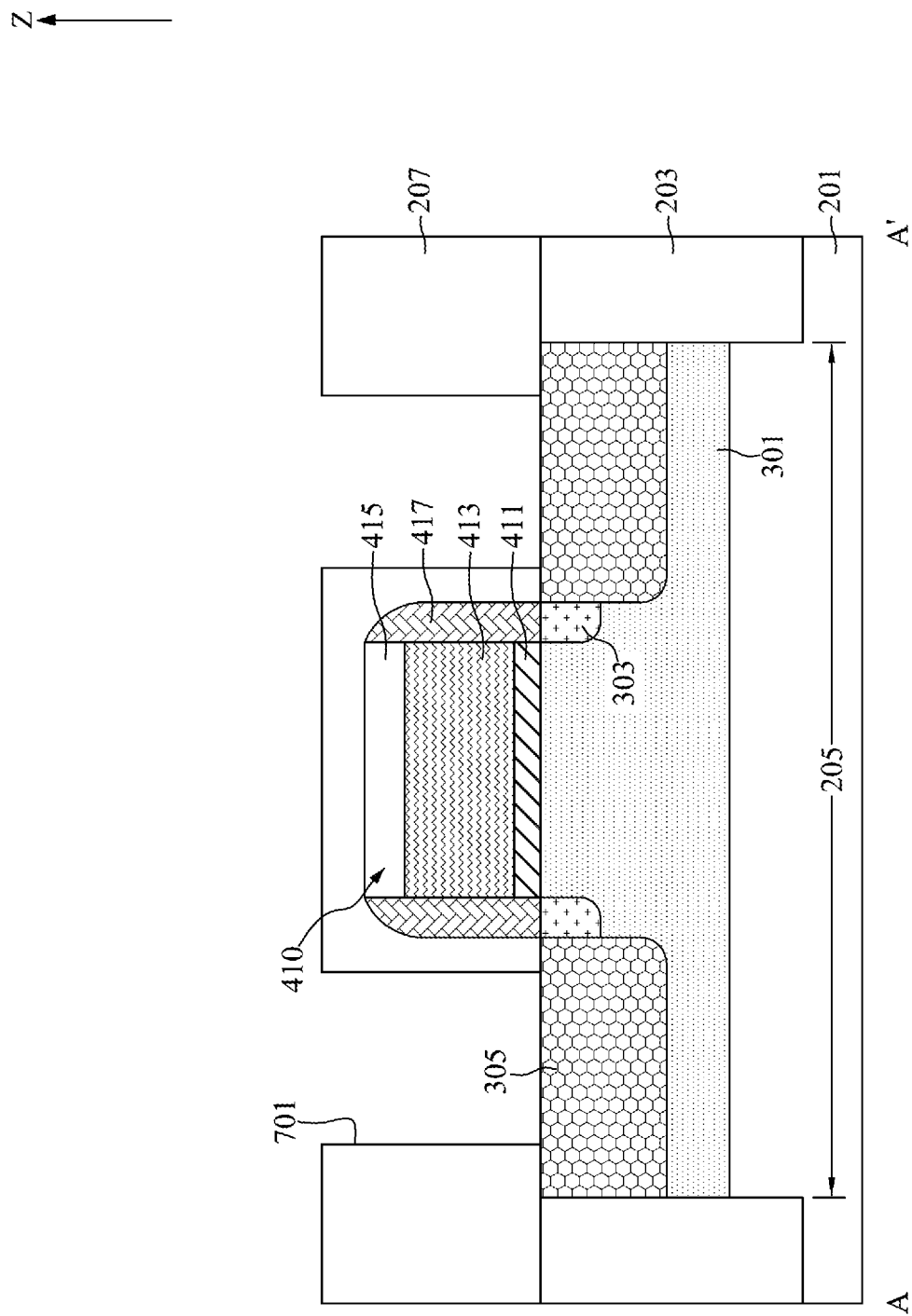
FIG. 18 is a schematic cross-sectional view diagram taken along a line A-A' in FIG. 17.
Figure 19:
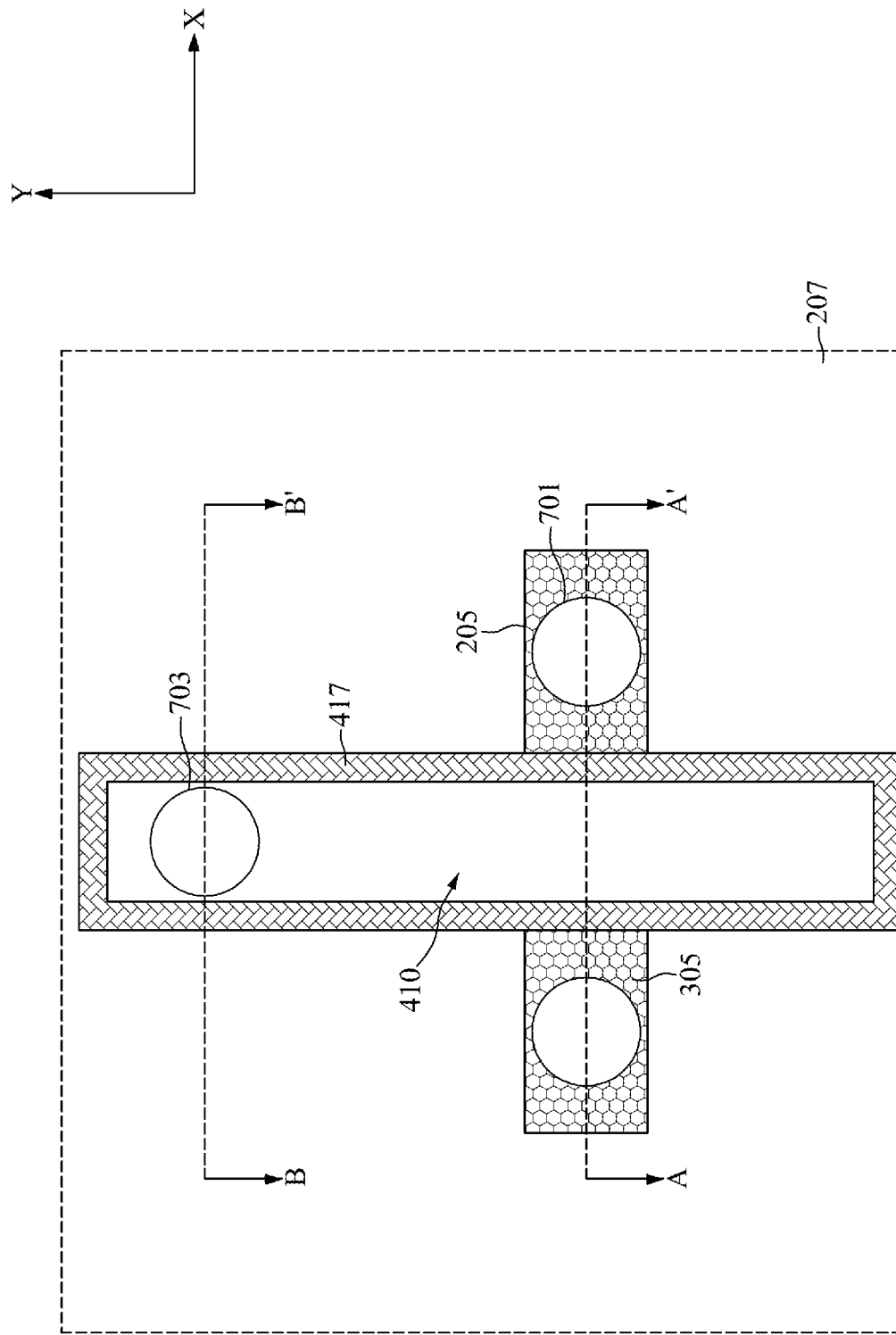
FIG. 19 illustrates, in a schematic top-view diagram, an intermediate semiconductor device in accordance with one embodiment of the present disclosure.
Figure 20:
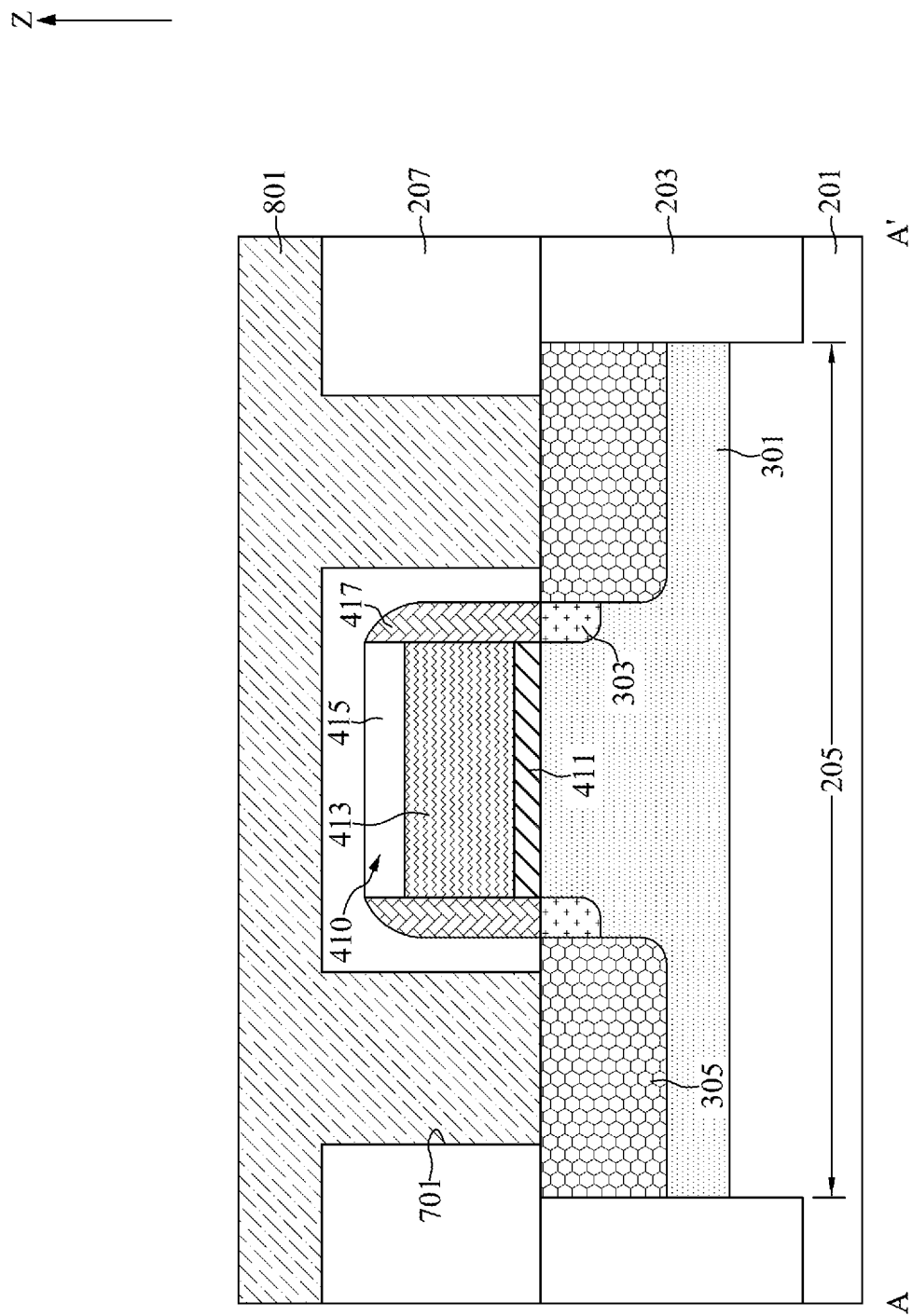
FIGS. 20 and 21 are schematic cross-sectional view diagrams taken along lines A-A' and B-B' in FIG. 19.
Figure 21:
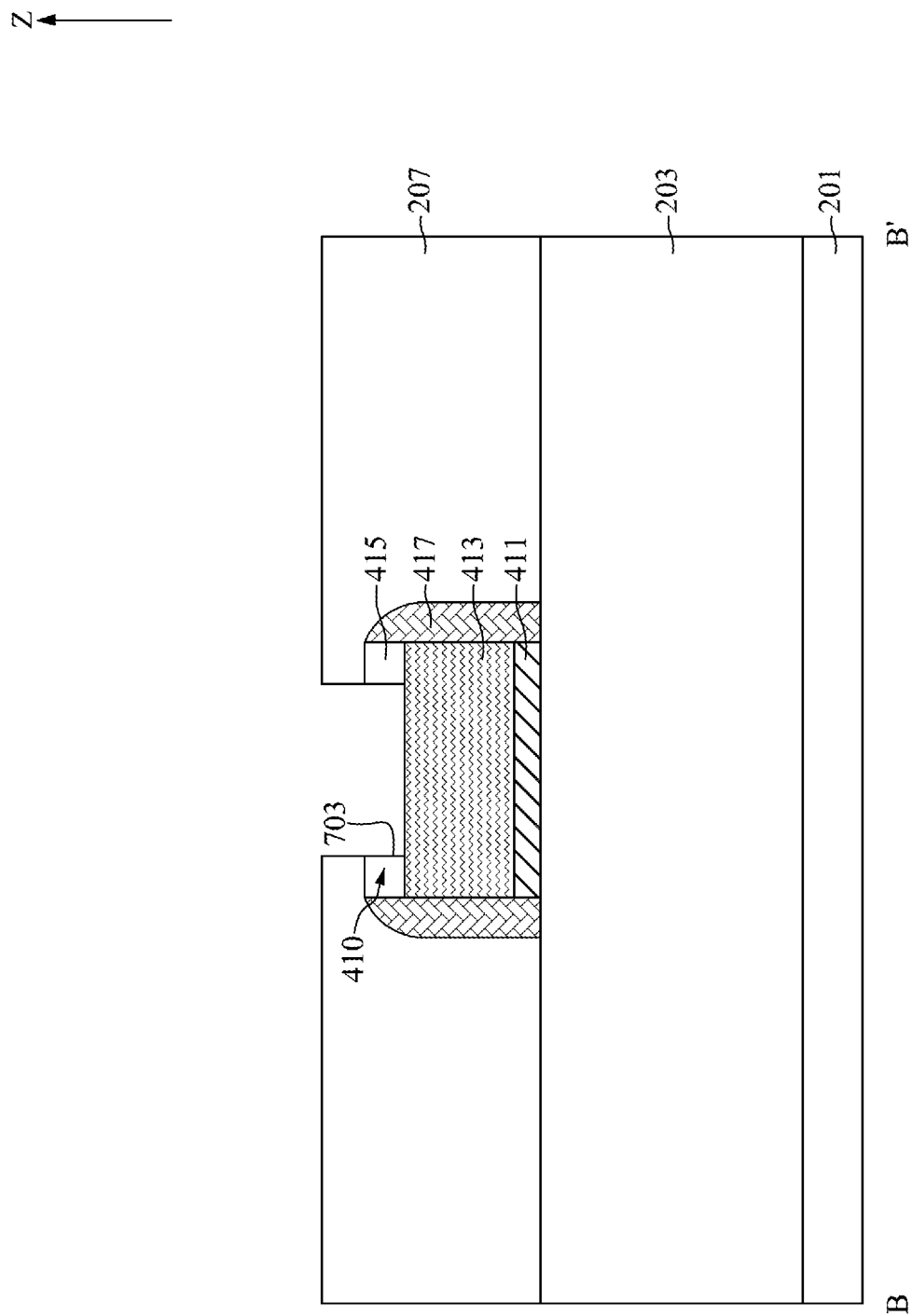

FIG. 17 illustrates, in a schematic top-view diagram, an intermediate semiconductor device in accordance with one embodiment of the present disclosure. FIG. 18 is a schematic cross-sectional view diagram taken along a line A-A' in FIG. 17. FIG. 19 illustrates, in a schematic top-view diagram, an intermediate semiconductor device in accordance with one embodiment of the present disclosure. FIGS. 20 and 21 are schematic cross-sectional view diagrams taken along lines A-A' and B-B' in FIG. 19.

With reference to FIGS. 4, 17, and 18, at step S31, a dielectric layer 207 may be formed over the substrate 201, and a plurality of first openings 701 may be formed to expose the plurality of impurity regions 305.

With reference to FIGS. 17 and 18, the dielectric layer 207 may be formed to cover the gate structure 410, the gate spacer 417, the plurality of impurity regions 305, and the isolation layer 203. A planarization process, such as chemical mechanical polishing, may be performed to provide a substantially flat surface for subsequent processing steps. The dielectric layer 207 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present disclosure denotes a dielectric material that has a dielectric constant of less than silicon dioxide. In some embodiments, the dielectric layer 207 may include a self-planarizing material such as a spin-on glass or a spin-on low-k dielectric material such as SiLK™. The use of a self-planarizing dielectric material may avoid the need to perform a subsequent planarizing step. In some embodiments, the dielectric layer 207 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIGS. 17 and 18, a plurality of first openings 701 may be formed along the dielectric layer 207 to expose the plurality of impurity regions 305, respectively and correspondingly. The plurality of first openings 701 may be formed by an etch process such as an anisotropic dry etch process with a pattern defining the position of the plurality of first openings 701.

With reference to FIG. 4 and FIGS. 19 to 21, at step S33, a gate contact opening 703 may be formed along the dielectric layer 207 to expose the gate structure 410.

With reference to FIGS. 19 to 21, the gate contact opening 703 may be formed along the dielectric layer 207 and the gate capping layer 415 to expose the gate conductive layer 413. The gate contact opening 703 may be formed by an etch process such as an anisotropic dry etch process with a first mask 801 defining the position of the gate contact opening 703. The first mask 801 may also cover the plurality of first openings 701 during the etch process of the gate contact opening 703. After the etch process of the gate contact opening 703, the first mask 801 may be removed. In a top-view perspective, the gate contact opening 703 may be distant from the active area 205. That is, the gate contact opening 703 may not be formed directly above the active area 205.

It should be noted that some elements (e.g., the dielectric layer 207 and the first mask 801) are not shown in schematic top-view diagrams for clarity.

FIGS. 22 to 27 are schematic cross-sectional view diagrams taken along lines A-A' and B-B' in FIG. 19 illustrating part of the flow for fabricating the semiconductor device 1A in accordance with one embodiment of the present disclosure.

With reference to FIG. 4 and FIGS. 22 to 27, at step S35, an under-layer 110 may be conformally formed over the substrate 201, an intervening layer 120 may be conformally formed on the under-layer 110, and a filler layer 130 may be formed on the intervening layer 120.

Figure 22:
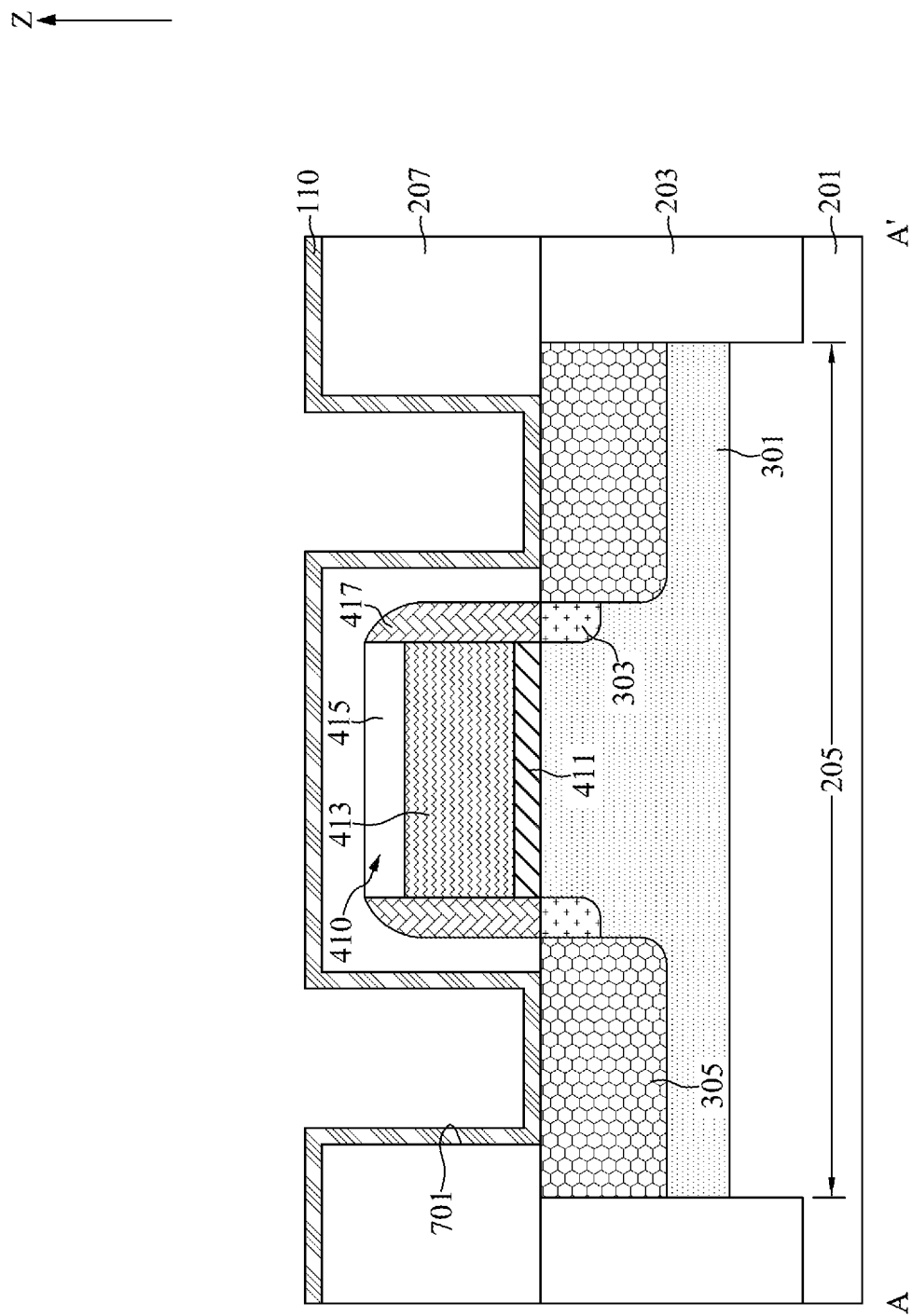
FIGS. 22 to 27 are schematic cross-sectional view diagrams taken along lines A-A' and B-B' in FIG. 19 illustrating part of the flow for fabricating the semiconductor device in accordance with one embodiment of the present disclosure.
Figure 23:
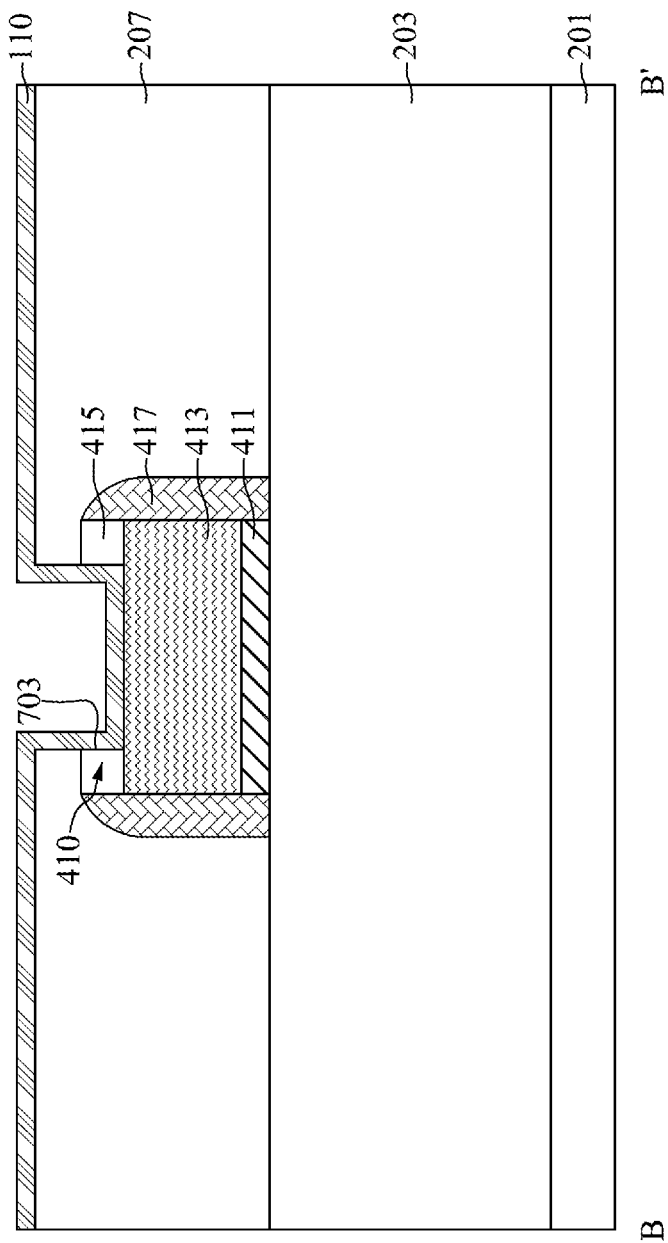

With reference to FIGS. 22 and 23, the under-layer 110 may be conformally formed in the plurality of first openings 701 and the gate contact opening 703. The under-layer 110 may be formed with a procedure similar to that illustrated in FIG. 2, and descriptions thereof are not repeated herein.

Figure 24:
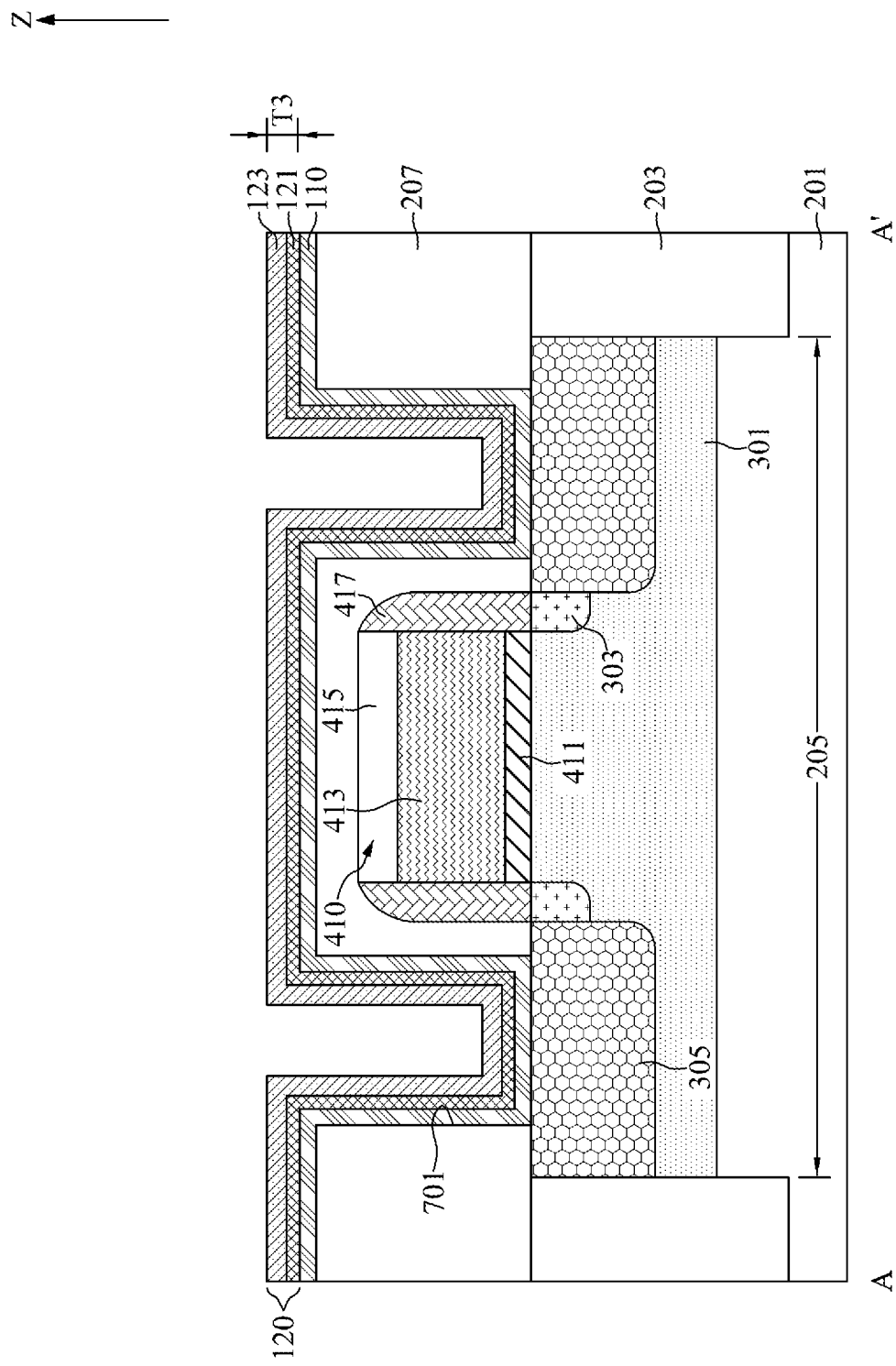
Figure 25:
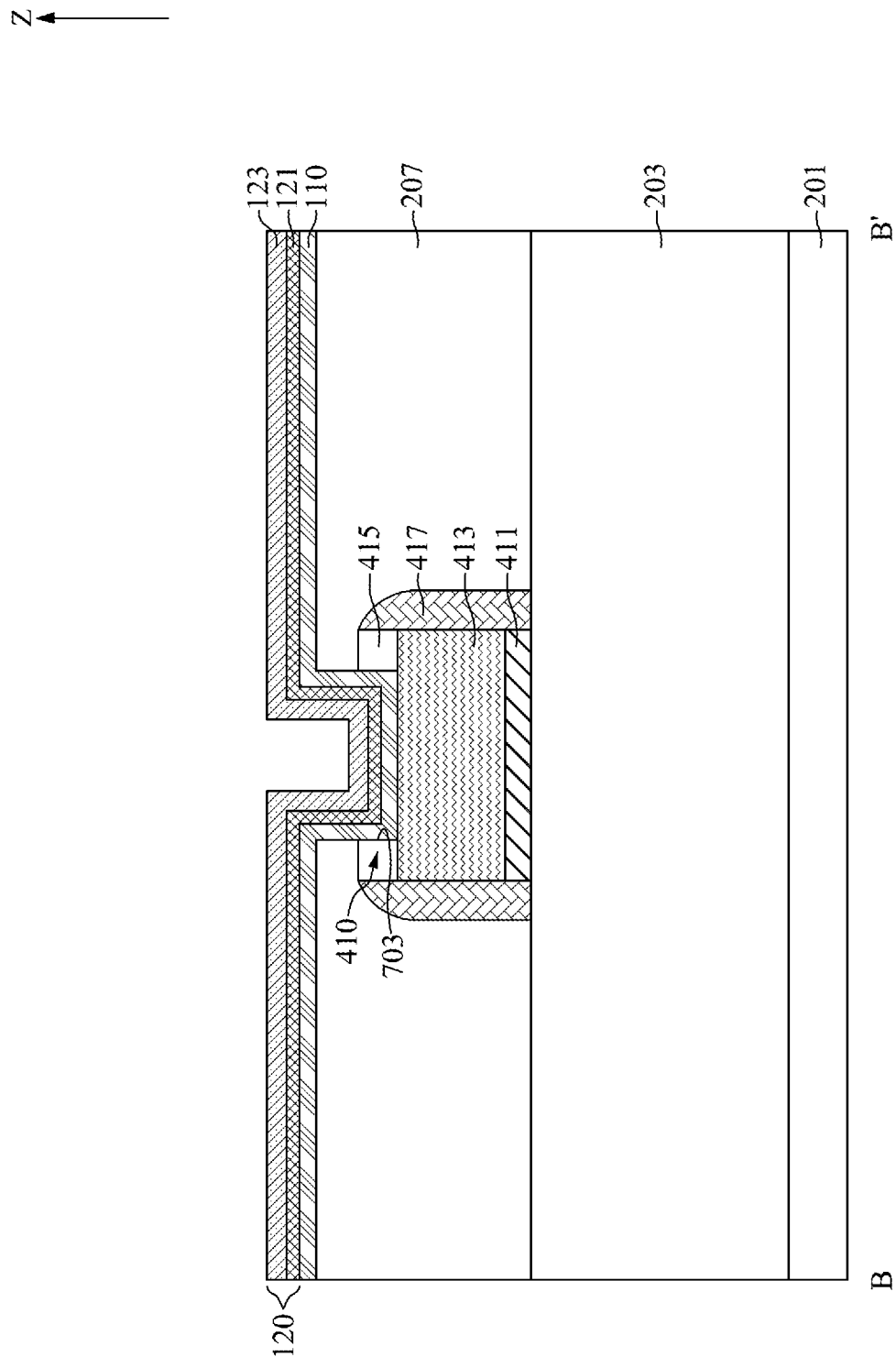

With reference to FIGS. 24 and 25, the intervening layer 120 may be conformally formed on the under-layer 110 and in the plurality of first openings 701 and the gate contact opening 703. The intervening layer 120 may include an intervening nucleation layer 121 and an intervening bulk layer 123. The thickness T3 of the intervening layer 120 may be greater than about 4.1 nm. In some embodiments, the thickness T3 of the intervening layer 120 may be greater than about 4.3 nm, than about 4.6 nm, or than about 5.2 nm. In some embodiments, the thickness T3 the intervening layer 120 may be between about 4.3 nm and about 4.6 nm. The intervening nucleation layer 121 and the intervening bulk layer 123 may be formed with a procedure similar to that illustrated in FIG. 2, and descriptions thereof are not repeated herein.

Figure 26:
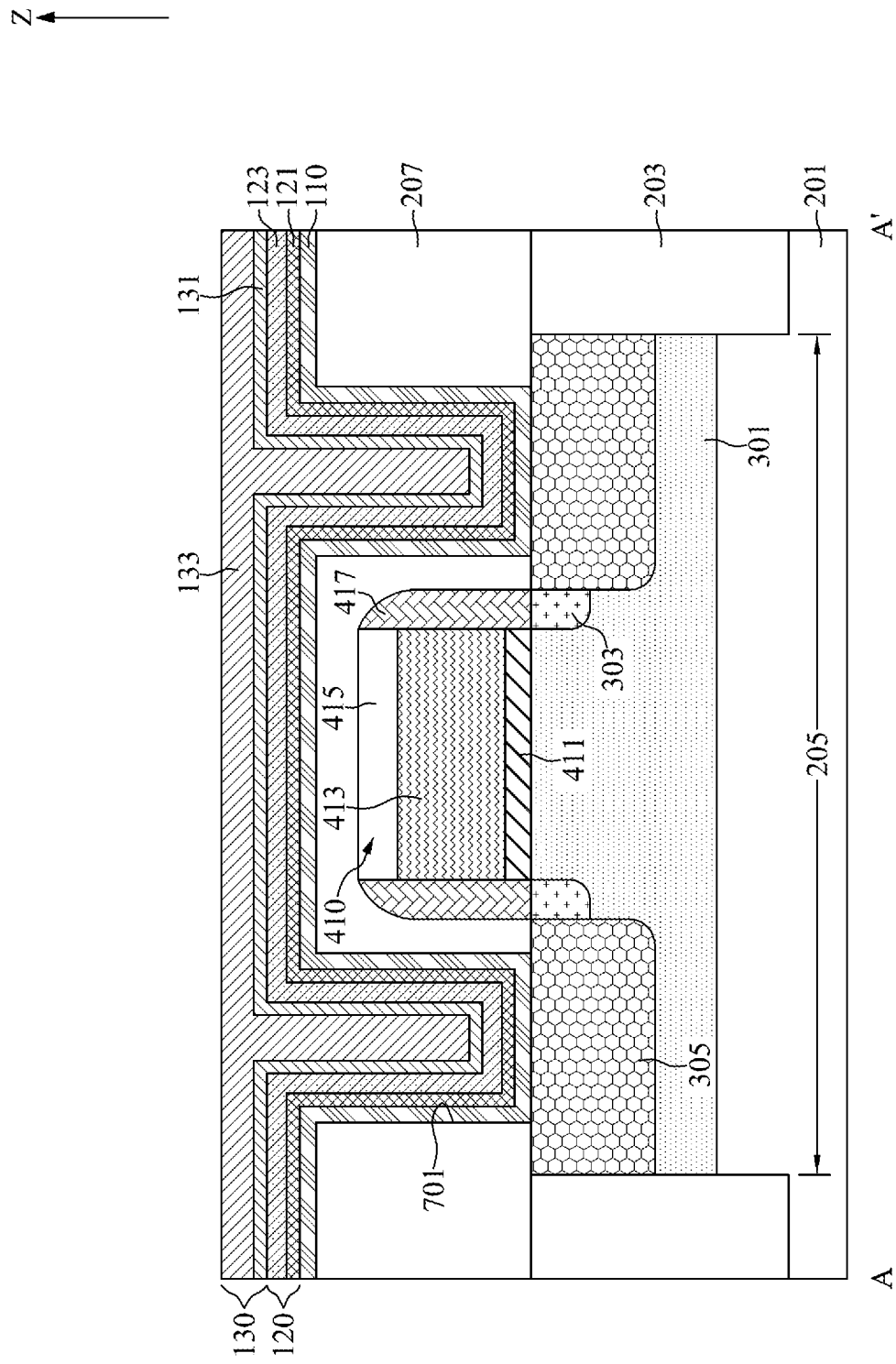
Figure 27:
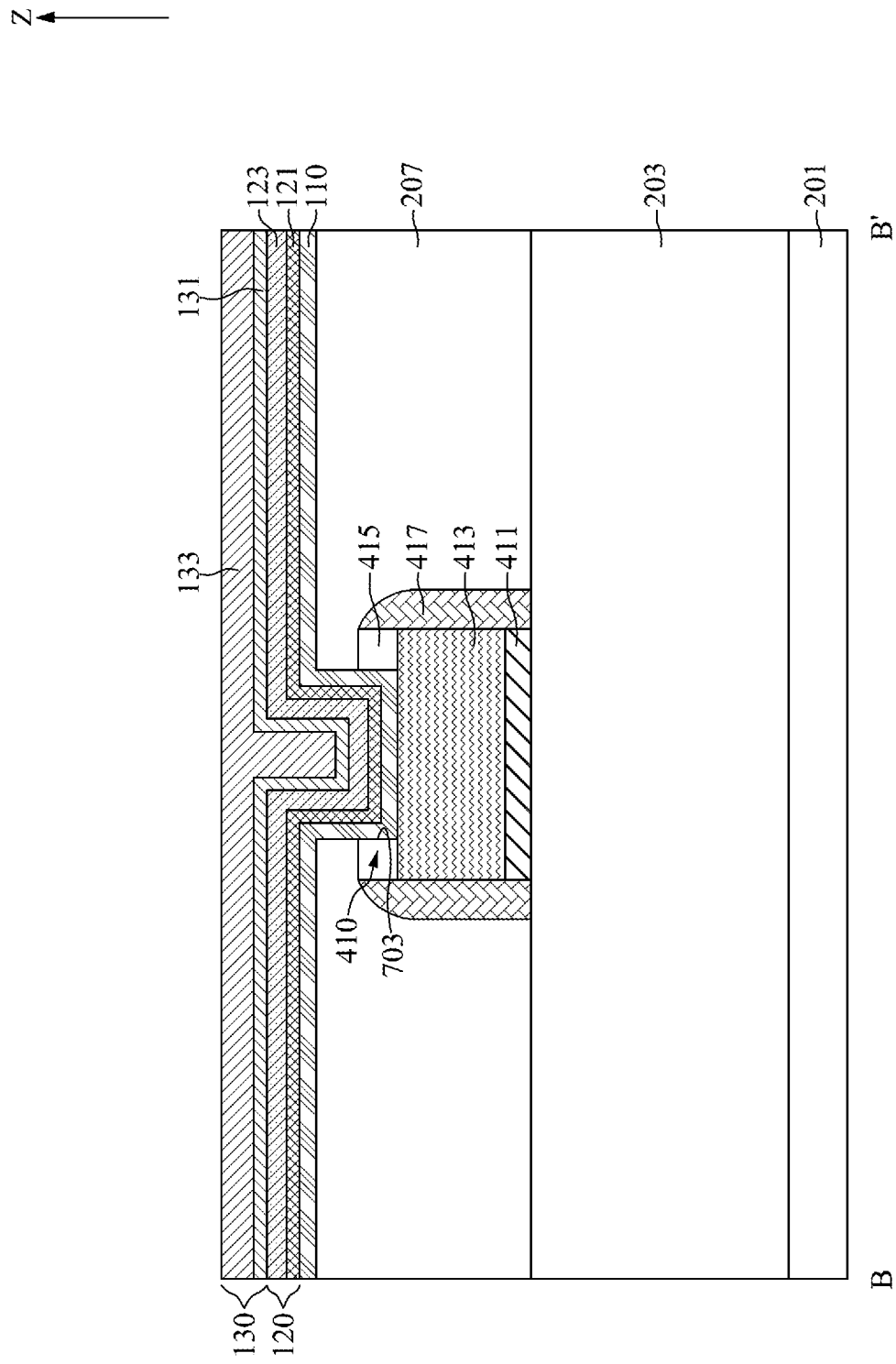

With reference to FIGS. 26 and 27, the filler layer 130 may include a filler nucleation layer 131 and a filler bulk layer 133. The filler nucleation layer 131 may be conformally formed on the intervening layer 120 and in the plurality of first openings 701 and the gate contact opening 703. The filler bulk layer 133 may be formed on the filler nucleation layer 131 and completely fill the plurality of first openings 701 and the gate contact opening 703. The filler nucleation layer 131 and the filler bulk layer 133 may be formed with a procedure similar to that illustrated in FIG. 3, and descriptions thereof are not repeated herein.

Figure 28:
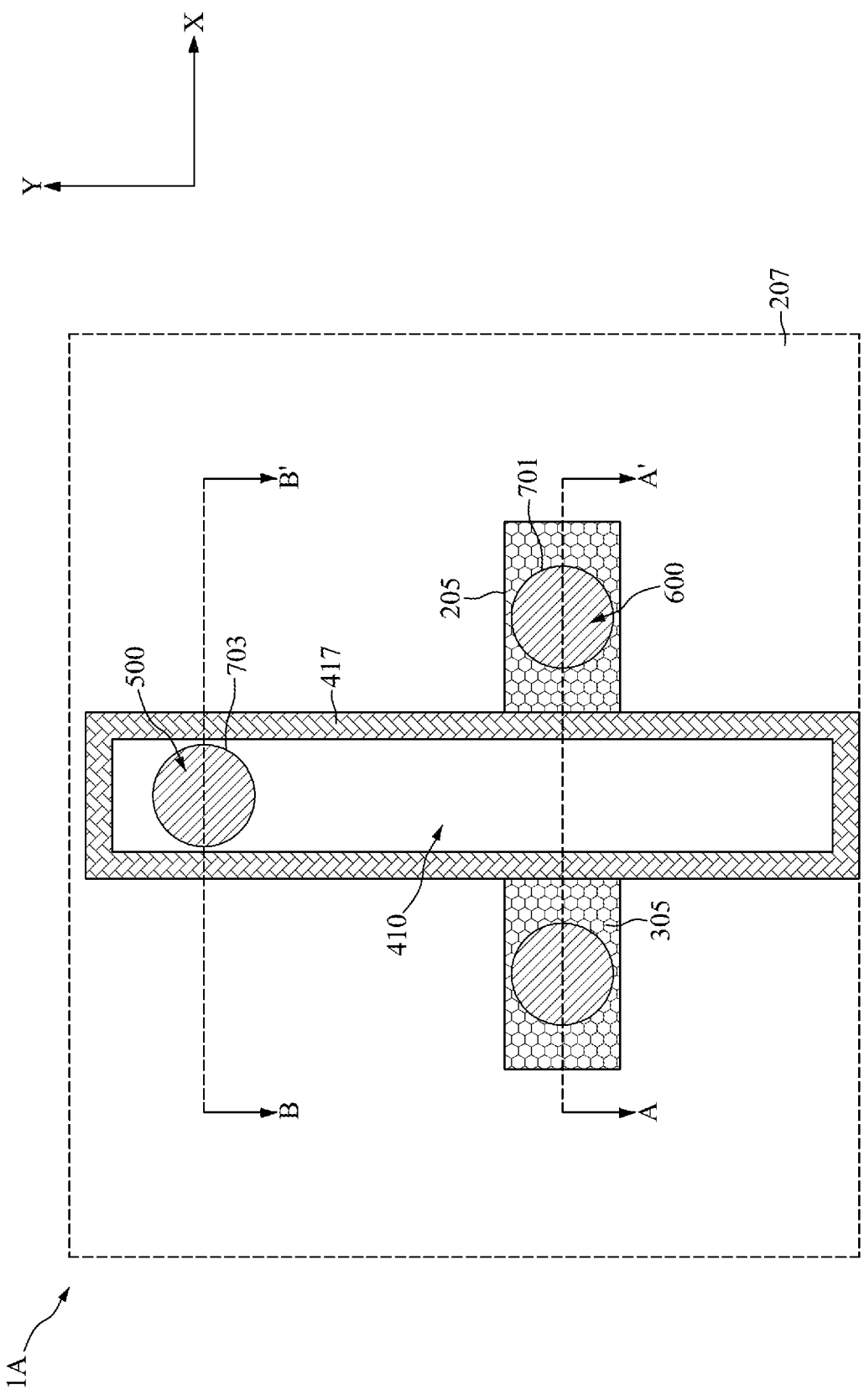
FIG. 28 illustrates, in a schematic top-view diagram, an intermediate semiconductor device in accordance with one embodiment of the present disclosure.
Figure 29:
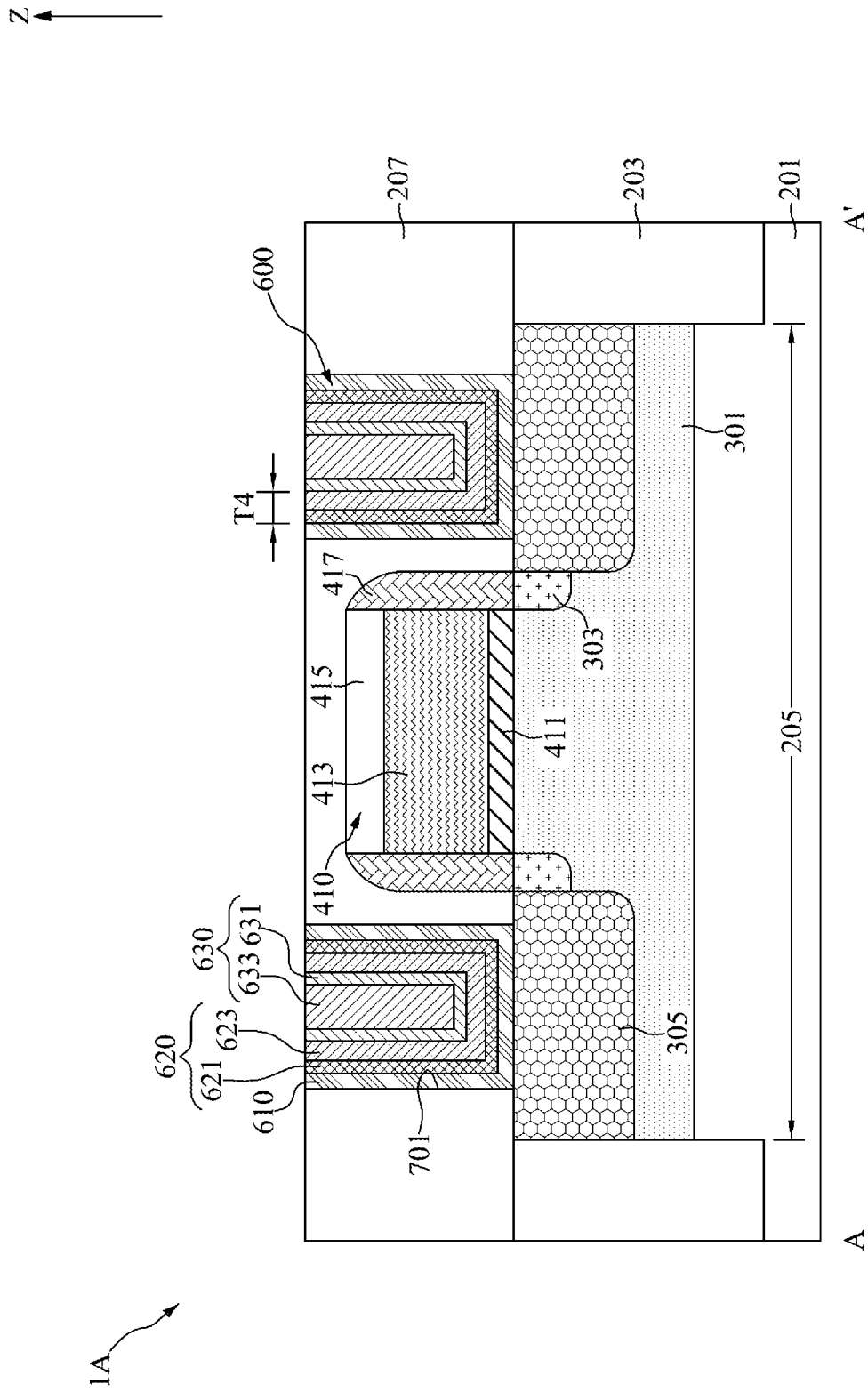
FIGS. 29 and 30 are schematic cross-sectional view diagrams taken along lines A-A' and B-B' in FIG. 28.
Figure 30:
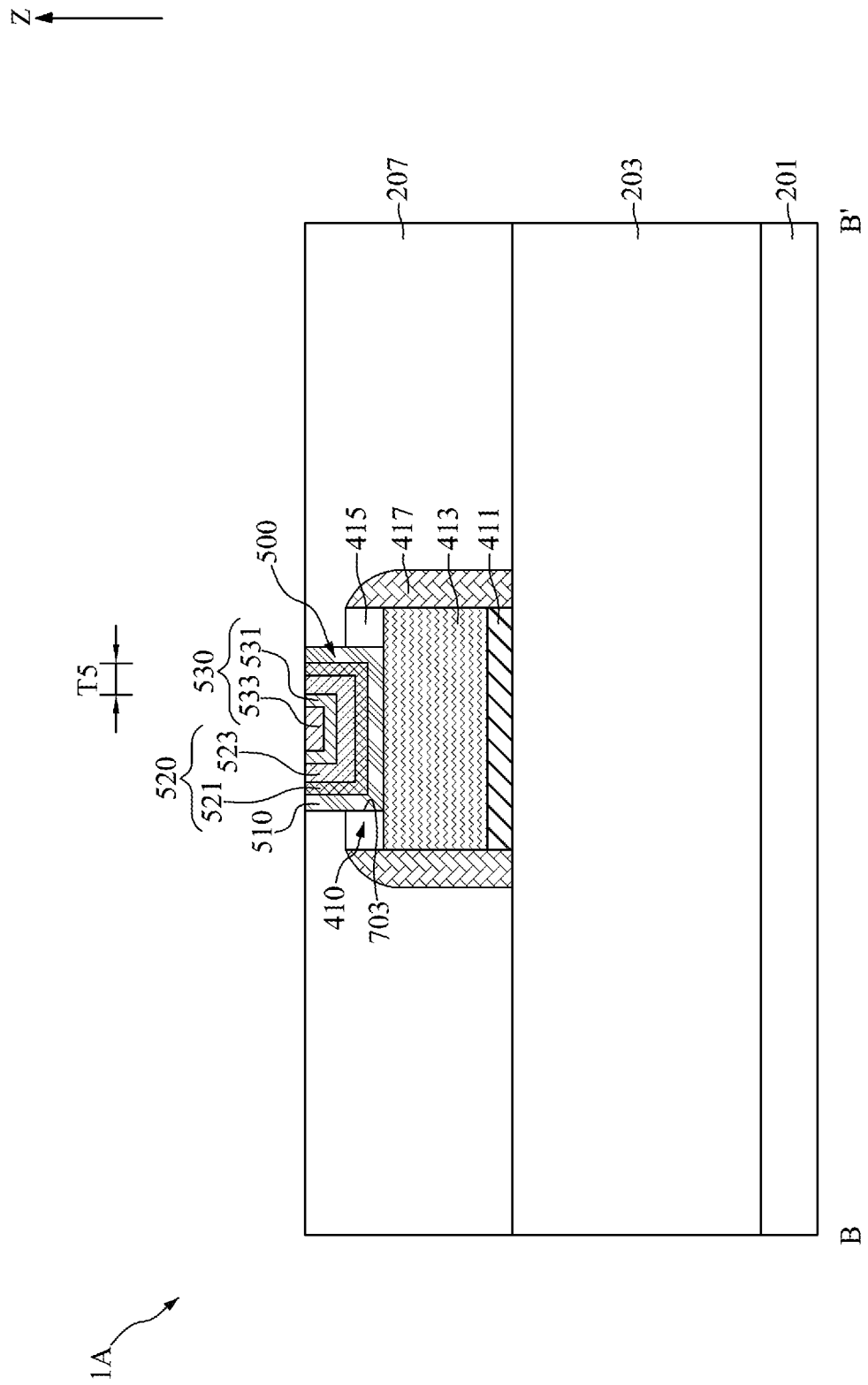

FIG. 28 illustrates, in a schematic top-view diagram, an intermediate semiconductor device in accordance with one embodiment of the present disclosure. FIGS. 29 and 30 are schematic cross-sectional view diagrams taken along lines A-A' and B-B' in FIG. 28.

With reference to FIG. 4 and FIGS. 28 to 30, at step S37, a planarization process may be performed to form a plurality of first contacts 600 in the plurality of first openings 701 and a gate contact 500 in the gate contact opening 703.

With reference to FIGS. 28 to 30, the planarization process, such as chemical mechanical polishing, may be performed until the top surface of the dielectric layer 207 is exposed. After the planarization process, the under-layer 110 may be turned into first contact (FC) barrier layers 610 in the plurality of first openings 701 and a gate contact (GC) barrier layer 510 in the gate contact opening 703.

The intervening nucleation layer 121 may be turned into FC intervening nucleation layers 621 in the plurality of first openings 701 and a GC intervening nucleation layer 521 in the gate contact opening 703. The intervening bulk layer 123 may be turned into FC intervening bulk layers 623 in the plurality of first openings 701 and a GC intervening bulk layer 523 in the gate contact opening 703. The FC intervening nucleation layer 621 and the FC intervening bulk layer 623 together configure a FC intervening layer 620. The GC intervening nucleation layer 521 and the GC intervening bulk layer 523 together configure a GC intervening layer 520.

The thickness T4 of the FC intervening layer 620 and the thickness T5 of the GC intervening layer 520 may be greater than about 4.1 nm. In some embodiments, the thickness T4 of the FC intervening layer 620 and the thickness T5 of the GC intervening layer 520 may be greater than about 4.3 nm, than about 4.6 nm, or than about 5.2 nm. In some embodiments, the thickness T4 of the FC intervening layer 620 and the thickness T5 of the GC intervening layer 520 may be between about 4.3 nm and about 4.6 nm.

The filler nucleation layer 131 may be turned into FC filler nucleation layer 631 in the plurality of first openings 701 and a GC filler nucleation layer 531 in the gate contact opening 703. The filler bulk layer 133 may be turned into FC filler bulk layers 633 in the plurality of first openings 701 and a GC filler bulk layer 533 in the gate contact opening 703. The FC filler nucleation layer 631 and the FC filler bulk layer 633 together configure a FC filler layer 630. The GC filler nucleation layer 531 and the GC filler bulk layer 533 together configure a GC filler layer 530.

With reference to FIGS. 28 to 30, the FC barrier layer 610, the FC intervening layer 620, and the FC filler layer 630 together configure the first contact 600. The GC barrier layer 510, the GC intervening layer 520, and the GC filler layer 530 together configure the gate contact 500.

Figure 31:
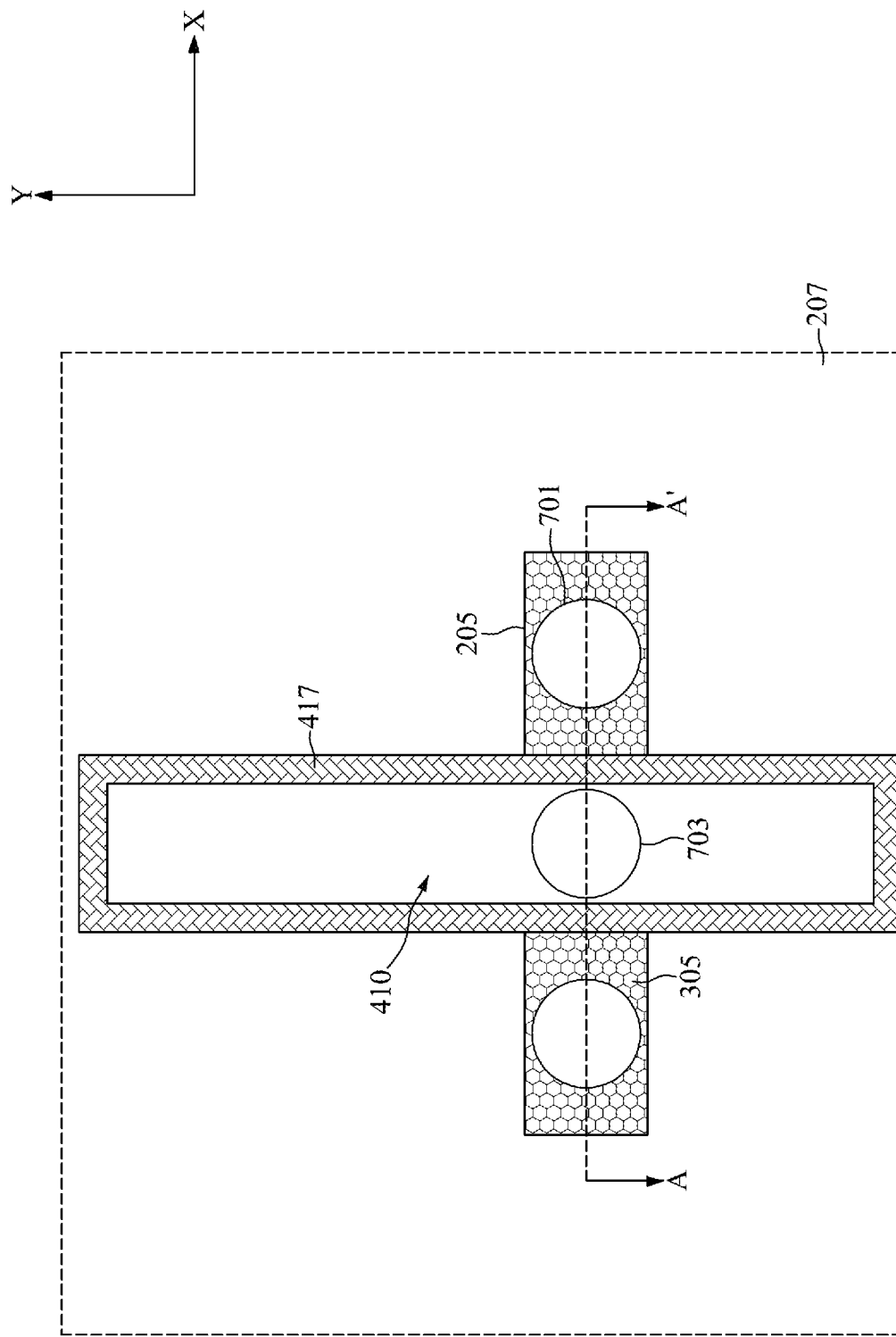
FIG. 31 illustrates, in a schematic top-view diagram, an intermediate semiconductor device in accordance with another embodiment of the present disclosure.
Figure 32:
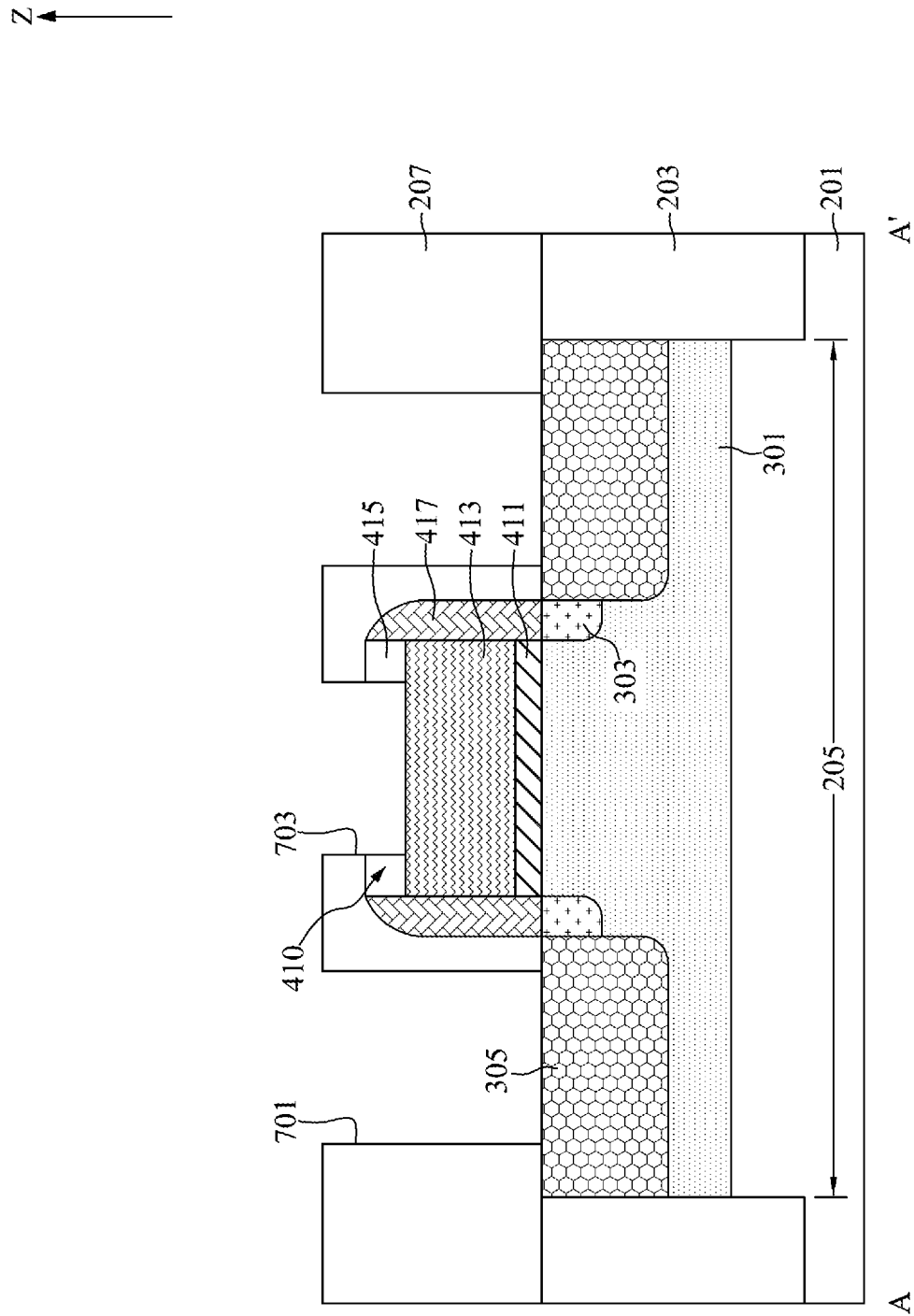
FIG. 32 is a schematic cross-sectional view diagram taken along a line A-A' in FIG. 31.
Figure 33:
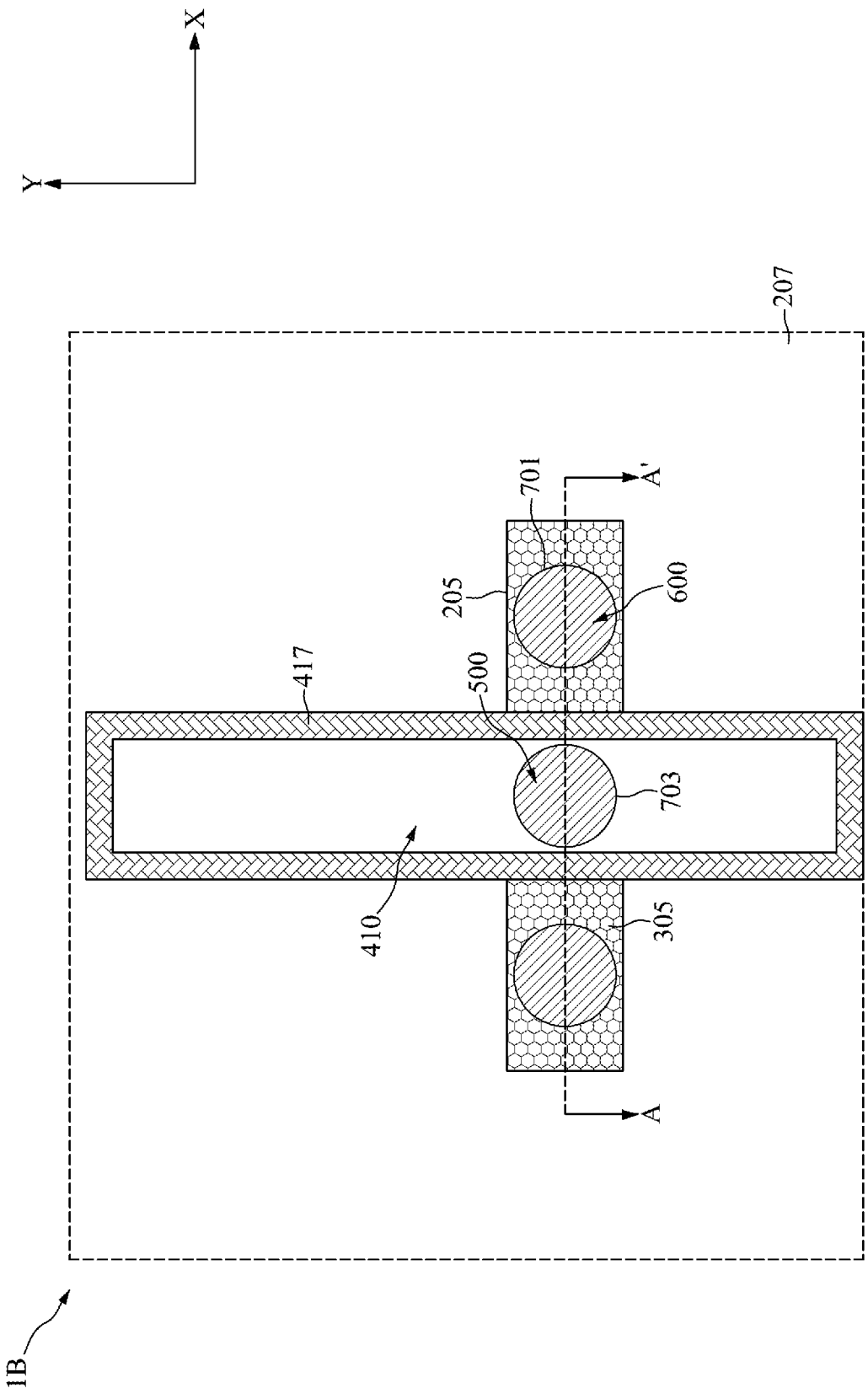
FIG. 33 illustrates, in a schematic top-view diagram, a semiconductor device in accordance with another embodiment of the present disclosure.
Figure 34:
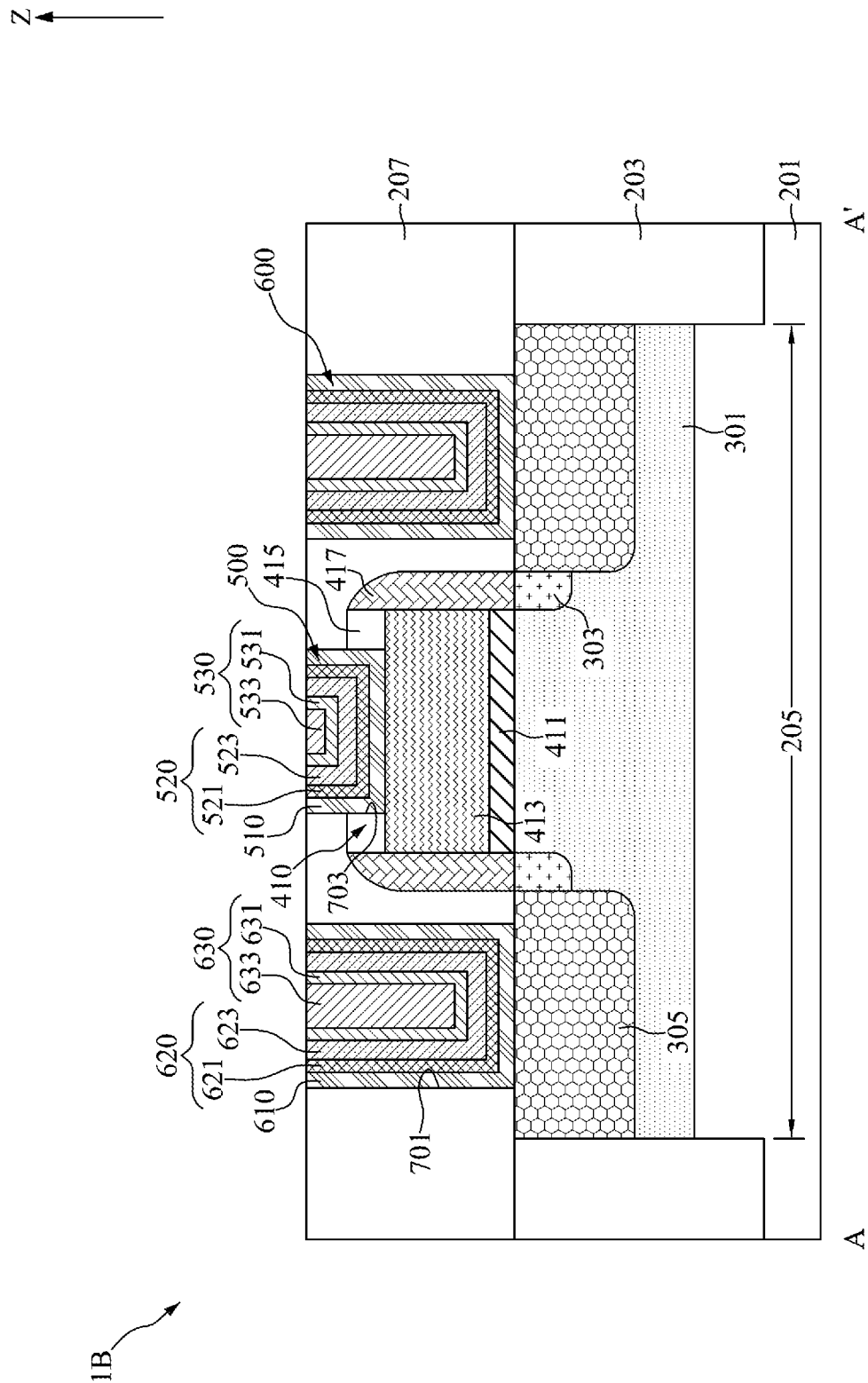
FIG. 34 is a schematic cross-sectional view diagram taken along a line A-A' in FIG. 33.

FIG. 31 illustrates, in a schematic top-view diagram, an intermediate semiconductor device in accordance with another embodiment of the present disclosure. FIG. 32 is a schematic cross-sectional view diagram taken along a line A-A' in FIG. 31. FIG. 33 illustrates, in a schematic top-view diagram, a semiconductor device 1B in accordance with another embodiment of the present disclosure. FIG. 34 is a schematic cross-sectional view diagram taken along a line A-A' in FIG. 33.

With reference to FIGS. 31 and 32, an intermediate semiconductor device may be fabricated with a procedure similar to that illustrated in FIGS. 5 to 18, and descriptions thereof are not repeated herein. The gate contact opening 703 may be formed along the dielectric layer 207 and the gate capping layer 415 to expose the gate conductive layer 413. The gate contact opening 703 may be formed directly above the active area 205.

With reference to FIGS. 33 and 34, the gate contact 500 and the first contacts 600 may be formed with a procedure similar to that illustrated in FIGS. 22 to 30, and descriptions thereof are not repeated herein.

One aspect of the present disclosure provides a conductive layer stack including an intervening layer comprising tungsten silicide and positioned on an under-layer; a filler layer comprising tungsten and positioned on the intervening layer. The under-layer comprises titanium nitride and comprises a columnar grain structure. A thickness of the intervening layer is greater than about 4.1 nm.

Another aspect of the present disclosure provides a semiconductor device including a substrate; a gate structure positioned on the substrate; a gate contact comprising: a gate contact barrier layer positioned on the gate structure and comprising titanium nitride having a columnar grain structure; a gate contact intervening layer positioned on the gate contact barrier layer and comprising tungsten silicide; a gate contact filler layer positioned on the gate contact barrier layer and comprising tungsten. A thickness of the gate contact intervening layer is greater than about 4.1 nm.

Another aspect of the present disclosure provides a method for fabricating a conductive layer stack including forming an intervening layer on an under-layer; and forming a filler layer on the intervening layer, wherein the filler layer comprises tungsten. The intervening layer comprises tungsten silicide and a thickness of the intervening layer is greater than 4.1 nm. The under-layer comprises titanium nitride and comprises a columnar grain structure.

Another aspect of the present disclosure provides a method for fabricating a semiconductor device including providing a substrate; forming a gate structure on the substrate; and forming a gate contact on the gate structure comprising: forming a gate contact barrier layer on the gate structure; forming a gate contact intervening layer on the gate contact barrier layer; and forming a gate contact filler layer on the gate contact barrier layer. The gate contact barrier layer comprises titanium nitride having a columnar grain structure. The gate contact intervening layer comprising tungsten silicide, and a thickness of the gate contact intervening layer is greater than about 4.1 nm. The gate contact filler layer comprises alpha phase tungsten.

Due to the design of the semiconductor device of the present disclosure, the intervening layer 120 is formed with a thickness greater than 4.1 nm to reduce or avoid the resistance uniformity issue. As a result, the reliability, yield, and performance of the semiconductor device may be improved. In addition, the filler layer 130 deposited using germanium-containing reducing agents may reduce resistance, thin filler nucleation layer 131 that yield alpha-tungsten growth, with the resulting filler bulk layer 133 causing has little or no defects.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a conductive layer stack, comprising:
    forming an under-layer on a substrate, wherein the under-layer comprises titanium nitride and comprises a columnar grain structure;
    forming an intervening layer on the under-layer which comprises titanium nitride, wherein the intervening layer comprises tungsten silicide and a thickness of the intervening layer is greater than 4.1 nm;
    exposing the intervening layer to pulses of a germanium-containing reducing agent in a hydrogen environment to form a layer of germanium on the intervening layer; and
    exposing the layer of germanium to pulses of a tungsten-containing precursor to form a filler layer on the intervening layer, wherein the filler layer comprises tungsten.

2. The method for fabricating the conductive layer stack of claim 1, wherein forming the intervening layer on the under-layer comprises:
    forming an intervening nucleation layer on the under-layer; and
    forming an intervening bulk layer on the intervening nucleation layer.

3. The method for fabricating the conductive layer stack of claim 2, wherein forming the filler layer on the intervening layer comprises:
    forming a filler nucleation layer on the intervening layer; and
    forming a filler bulk layer on the filler nucleation layer.

4. The method for fabricating the conductive layer stack of claim 3, wherein tungsten of the filler layer is alpha phase tungsten.

5. The method for fabricating the conductive layer stack of claim 4, wherein forming the intervening nucleation layer on the under-layer comprising:
    flowing a reactant gas, a first silicon source gas, and an inert carrier gas over the under-layer; and
    switching the first silicon source gas to a second silicon source gas to form the intervening nucleation layer.

6. The method for fabricating the conductive layer stack of claim 5, wherein the first silicon source gas is silane, and the second silicon source gas is dichlorosilane.

7. The method for fabricating the conductive layer stack of claim 6, wherein the reactant gas is tungsten hexafluoride.

8. The method for fabricating the conductive layer stack of claim 7, wherein the inert carrier gas is argon, nitrogen, helium, or a combination thereof.

9. The method for fabricating the conductive layer stack of claim 8, wherein a flow rate of the inert carrier gas is as great as five to ten times the flow rate of the first silicon source gas.

10. A method for fabricating a semiconductor device, comprising:
    providing a substrate;
    forming a gate structure on the substrate; and
    forming a gate contact on the gate structure comprising:
        forming a gate contact barrier layer on the gate structure;
        forming a gate contact intervening layer on the gate contact barrier layer which comprises titanium nitride;
        exposing the gate contact intervening layer to pulses of a germanium-containing reducing agent in a hydrogen environment to form a layer of germanium on the gate contact intervening layer; and
        exposing the layer of germanium to pulses of a tungsten-containing precursor to form a gate contact filler layer on the gate contact barrier layer;
    wherein the gate contact barrier layer comprises a columnar grain structure;
    wherein the gate contact intervening layer comprises tungsten silicide, and a thickness of the gate contact intervening layer is greater than about 4.1 nm;

wherein the gate contact filler layer comprises alpha phase tungsten.

* * * * *